US011460508B2

(12) United States Patent
Kawamoto et al.

(10) Patent No.: US 11,460,508 B2
(45) Date of Patent: Oct. 4, 2022

(54) IDENTIFIER ASSIGNMENT METHOD AND SYSTEM

(71) Applicant: DENSO CORPORATION, Kariya (JP)

(72) Inventors: Shinsuke Kawamoto, Kariya (JP); Hayato Mizoguchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 391 days.

(21) Appl. No.: 16/804,550

(22) Filed: Feb. 28, 2020

(65) Prior Publication Data

US 2020/0284844 A1 Sep. 10, 2020

(30) Foreign Application Priority Data

Mar. 4, 2019 (JP) .............................. JP2019-038947

(51) Int. Cl.
*G01R 31/3835* (2019.01)
*G01R 31/396* (2019.01)
*H04W 4/40* (2018.01)
*G07C 5/08* (2006.01)
*G07C 5/00* (2006.01)

(52) U.S. Cl.
CPC ....... *G01R 31/3835* (2019.01); *G01R 31/396* (2019.01); *G07C 5/008* (2013.01); *G07C 5/0816* (2013.01); *H04W 4/40* (2018.02)

(58) Field of Classification Search
CPC .............. G01R 31/3835; G01R 31/396; G01R 31/371; G07C 5/008; G07C 5/0816; H04W 4/40
See application file for complete search history.

(56) References Cited

U.S. PATENT DOCUMENTS

| 11,011,917 | B2* | 5/2021 | Park | H02J 7/0047 |
|---|---|---|---|---|
| 11,265,223 | B2* | 3/2022 | Kim | H04L 12/403 |
| 11,330,981 | B2* | 5/2022 | Andersen | A61B 5/686 |
| 11,333,709 | B2* | 5/2022 | Ito | B60L 58/18 |
| 2017/0222275 | A1* | 8/2017 | Krishnan | H02J 7/0048 |
| 2018/0278066 | A1* | 9/2018 | Kurahashi | B60L 58/21 |
| 2020/0064408 | A1* | 2/2020 | Sato | H01M 10/441 |
| 2020/0076013 | A1* | 3/2020 | Sato | H01M 10/425 |
| 2020/0168960 | A1* | 5/2020 | Murase | B60L 3/0092 |
| 2021/0247461 | A1* | 8/2021 | Park | H01M 10/482 |

FOREIGN PATENT DOCUMENTS

JP 5168176 B2 3/2013

* cited by examiner

*Primary Examiner* — Nha T Nguyen
(74) *Attorney, Agent, or Firm* — Oliff PLC

(57) ABSTRACT

In an identifier assignment system for assigning identifiers to respective voltage monitors to be connected to respective battery units, each measuring unit measures elapsed time information indicative of an elapsed time that has elapsed since a predetermined point of time after an activation of the corresponding voltage monitor based on power supplied from the corresponding battery unit connected to the corresponding voltage monitor. Each measuring unit is also configured to wirelessly transmit the elapsed time information about the corresponding voltage monitor. A comparison unit performs a comparison task of comparing the elapsed times of the respective voltage monitors with each other. An assignment unit is configured to assign unique identifiers to the respective voltage monitors in accordance with a result of the comparison task.

9 Claims, 11 Drawing Sheets

IDENTIFIER ASSIGNMENT METHOD AND SYSTEM

CROSS-REFERENCE TO RELATED APPLICATION

This application is based on and claims the benefit of priority from earlier Japanese Patent Application No. 2019-038947 filed on Mar. 4, 2019, the entire disclosure of which is incorporated herein by reference.

TECHNICAL FIELD

The present disclosure relates to methods and systems for assigning an identifier (ID) to each of a plurality of voltage monitors.

BACKGROUND

Battery monitor apparatuses monitor a battery pack comprised of a plurality of battery cells; the battery pack is configured to be installable in a vehicle.

SUMMARY

According to an aspect of the present disclosure, there is provided an identifier assignment system for assigning identifiers to respective voltage monitors to be connected to respective battery units. Each measuring unit measures elapsed time information indicative of an elapsed time that has elapsed since a predetermined point of time after activation of the corresponding voltage monitor based on power supplied from the corresponding battery unit connected to the corresponding voltage monitor. Each measuring unit is also configured to wirelessly transmit the elapsed time information about the corresponding voltage monitor. A comparison unit performs a comparison task of comparing the elapsed times of the respective voltage monitors with each other. An assignment unit is configured to assign unique identifiers to the respective voltage monitors in accordance with a result of the comparison task.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENT

Disclosure's View Point

Figure 1:
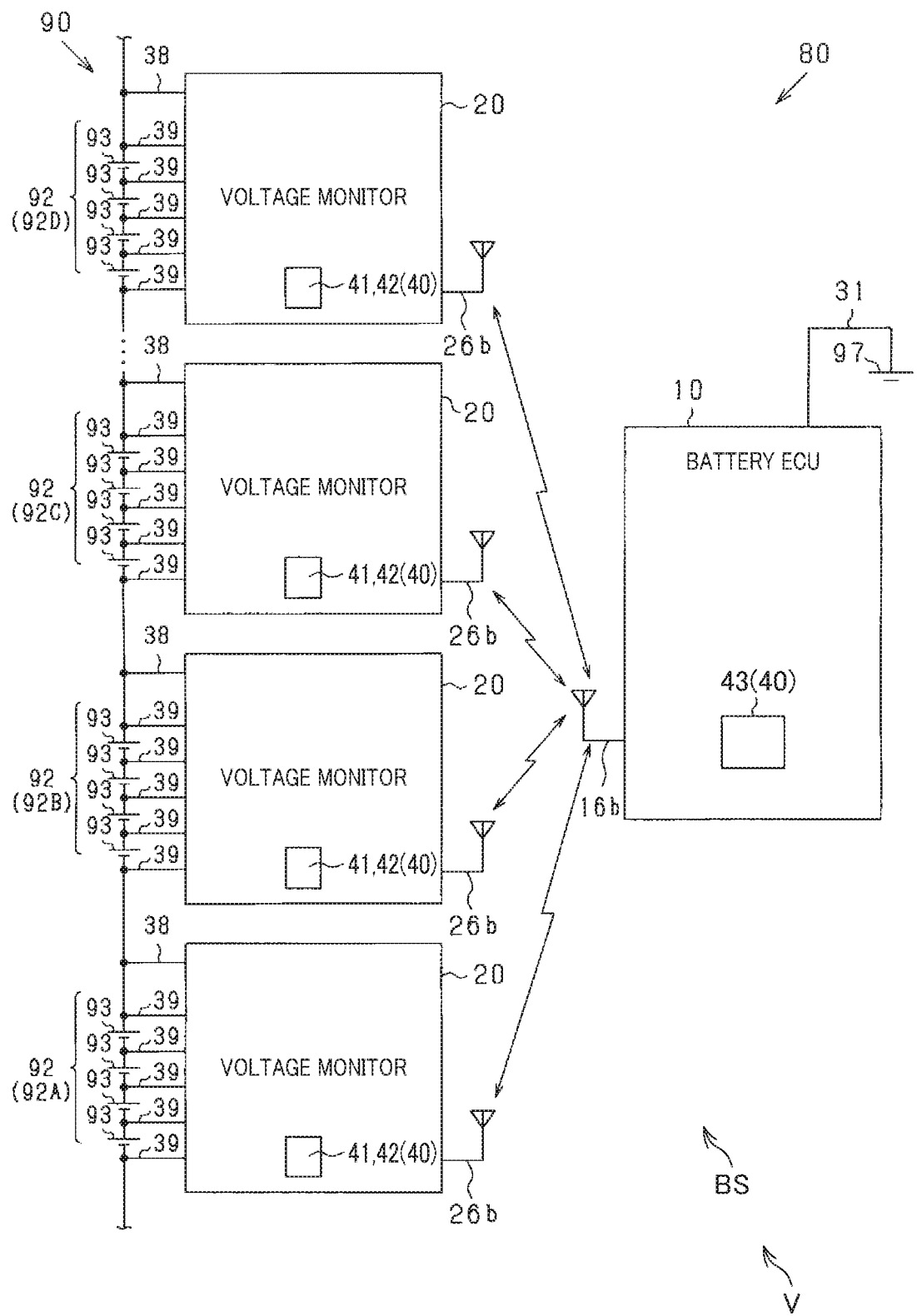
FIG. 1 is a block diagram schematically illustrating an ID assignment system according to the first embodiment of the present disclosure.

Battery monitor apparatuses monitor a battery pack comprised of a plurality of battery cells; the battery pack is configured to be installable in a vehicle. A typical example of such battery monitor apparatuses, which is for example disclosed in Japanese Patent Publication No. 5168176, includes a battery controller, such as a battery electronic control unit (ECU), and a plurality of voltage monitors connected to the battery ECU via respective connection members.

Specifically, the battery cells are categorized into plural groups, which will be referred to as battery groups, and the battery monitors are provided for the respective battery groups. Each of the battery monitors obtains a measurement indicative of a voltage across each battery cell included in the corresponding one of the battery groups, and transmits, to the battery ECU via the corresponding connection member, the measurement indicative of the voltage across each battery cell included in the corresponding one of the battery groups.

In recent years, a maximum power level used by vehicles has been tending to increase. This increase in the maximum power level requires the number of battery cells included in each battery pack used for vehicles to increase, resulting in an increase in both the number of battery groups and the number of battery monitors provided for the respective battery monitors. This increase in both the number of battery groups and the number of battery monitors provided for the respective battery monitors results in the number of connection members, each of which connects between a corresponding one of the battery monitors and the battery ECU, increasing.

From this viewpoint, the disclosures of the present disclosure have been considering wireless communications, i.e. radio communications, between each battery monitor and the battery ECU.

Communications between the battery ECU and each battery monitor requires the battery ECU to recognize, when receiving the measurement transmitted from one of the battery monitors, which of the battery monitors has transmitted the received measurement. For this requirement, the disclosures of the present disclosure have been considering assigning identifiers (IDs) to the respective battery monitors;

each ID assigned to the corresponding one of the battery monitors uniquely identifiers the corresponding one of the battery groups.

For such a battery monitor apparatus using the connection members set forth above, the battery ECU is capable of recognizing which of the battery monitors is connected to which of the battery groups in accordance with a connection relationship between the connection member connected to each battery monitor and the corresponding battery group. This enables the battery ECU to uniquely assign IDs to the respective battery monitors.

Unfortunately, for such a battery monitor apparatus using radio communications set forth above, it may be difficult for the battery ECU to recognize which of the battery monitors is connected to which of the battery groups in accordance with the connection relationship between the wiring member connected to each battery monitor and the corresponding battery group. For this reason, for such a battery monitor apparatus using radio communication, it may be necessary to uniquely assign IDs to the respective battery monitors using another approach to thereby enable the battery ECU to recognize which of the battery monitors is connected to which of the battery groups.

From this viewpoint, the present disclosure aims to provide identifier assignment methods and systems, each of which is capable of assigning identifiers to respective battery monitors while enabling a battery controller to recognize which of the battery monitors is connected to which of batteries, i.e. battery groups, even if the battery monitors are wirelessly connected to the battery controller.

According to a first exemplary aspect of the present disclosure, there is provided an identifier assignment system for assigning identifiers to respective voltage monitors to be connected to respective battery units. The identifier assignment system includes a plurality of measuring units provided for the respective voltage monitors. Each measuring unit is configured to measure elapsed time information indicative of an elapsed time that has elapsed since a predetermined point of time after activation of the corresponding voltage monitor based on power supplied from the corresponding battery unit connected to the corresponding voltage monitor, and wirelessly transmit the elapsed time information about the corresponding voltage monitor. The identifier assignment system includes a comparison unit configured to receive the elapsed time information about each voltage monitor wirelessly transmitted from the corresponding measuring unit, and perform a comparison task of comparing the elapsed times of the respective voltage monitors with each other. The identifier assignment system includes an assignment unit configured to assign unique identifiers to the respective voltage monitors in accordance with a result of the comparison task.

In addition, according to a second exemplary aspect of the present disclosure, there is provided an identifier assignment method for assigning identifiers to respective voltage monitors to be connected to respective battery units. The identifier assignment method includes 1. Measuring elapsed time information indicative of an elapsed time that has elapsed since a predetermined point of time after an activation of the corresponding voltage monitor based on power supplied from the corresponding battery unit connected to the corresponding voltage monitor 2. Wirelessly transmitting the elapsed time information about the corresponding voltage monitor 3. Receiving the elapsed time information about each voltage monitor wirelessly transmitted from the corresponding measuring step 4. Performing a comparison task of comparing the elapsed times of the respective voltage monitors with each other 5. Assigning unique identifiers to the respective voltage monitors in accordance with a result of the comparing step In each of the first and second exemplary aspects of the present disclosure, a worker's connection work of connecting the voltage monitors to the respective battery units in a given order enables unique IDs to be easily assigned to the respective battery monitors 20 for the respective battery units.

EMBODIMENT

The following describes embodiments of the present disclosure with reference to the accompanying drawings. In the embodiments, like parts between the embodiments, to which like reference characters are assigned, are omitted or simplified to avoid redundant description.

First Embodiment

FIG. 1 schematically illustrates a battery system BS including an ID assignment system 40 and its peripheral configuration according to the first embodiment of the present disclosure.

The battery system BS is configured to be installable in a vehicle V. The battery system BS of the first embodiment is installed in the vehicle V.

The battery system BS includes a battery pack 90, a battery monitor apparatus 80, and a battery ECU 10. The battery system BS is for example capable of supplying electrical power from the battery pack 90 to external devices installed in the vehicle V; the external devices include, for example, a running power device, such as an internal combustion engine and/or a motor-generator, which serves as a main engine of the vehicle V. The battery system BS also serves as an auxiliary battery system of the vehicle V together with an auxiliary battery 97 installed in the vehicle V.

The battery pack 90 includes a plurality of battery cells 93 connected in series to one another. The battery cells 93 are organized into a plurality of battery groups 92.

The battery monitor apparatus 80 includes a battery electronic control unit (ECU) 10, a plurality of voltage monitors 20, a power supply line 31, a plurality of power supply lines 38, and a plurality of voltage measurement lines 39.

The ID assignment system 40 installed in the battery system BS includes an assignment unit 41, a plurality of measuring units 42, and a comparison unit 43.

The number of battery groups 92 is set to 4 according to the first embodiment, but can be set to any value equal to or more than 2, such as 5 or more, or 3 or less. In particular, the four battery groups 92 consist of a first battery group 92A, a second battery group 92B, a third battery group 92C, and a fourth battery group 92D in ascending order of potential.

Each of the battery groups 92 is comprised of plural battery cells 93 connected in series to one another.

For example, each battery group 92 is comprised of four battery cells 93 connected in series to one another. If the four battery cells 93 are called first to fourth battery cells 93 in ascending order of potential, each battery group 92 is configured such that 1. The positive terminal of the first battery cell 93 is connected to the negative terminal of the second battery cell 93

2. The positive terminal of the second battery cell 93 is connected to the negative terminal of the third battery cell 93

3. The positive terminal of the third battery cell 93 is connected to the negative terminal of the fourth battery cell 93

Each battery cell 93 can be comprised of a unit cell, or can be comprised of plural unit cells connected in series to each other. For example, the first embodiment uses a lithium-ion secondary battery cell as each battery cell 93, but can use another type of rechargeable battery cell.

The number of voltage monitors 20 is set to conform with the number of battery groups 92, so that the number of voltage monitors 20 is set to 4. In other words, the voltage monitors 20 are provided for respective battery groups 92.

The measuring units 42 are for example installed in the respective voltage monitors 20, and the assignment unit 41 and comparison unit 43 are for example installed in the battery ECU 10.

Figure 2:
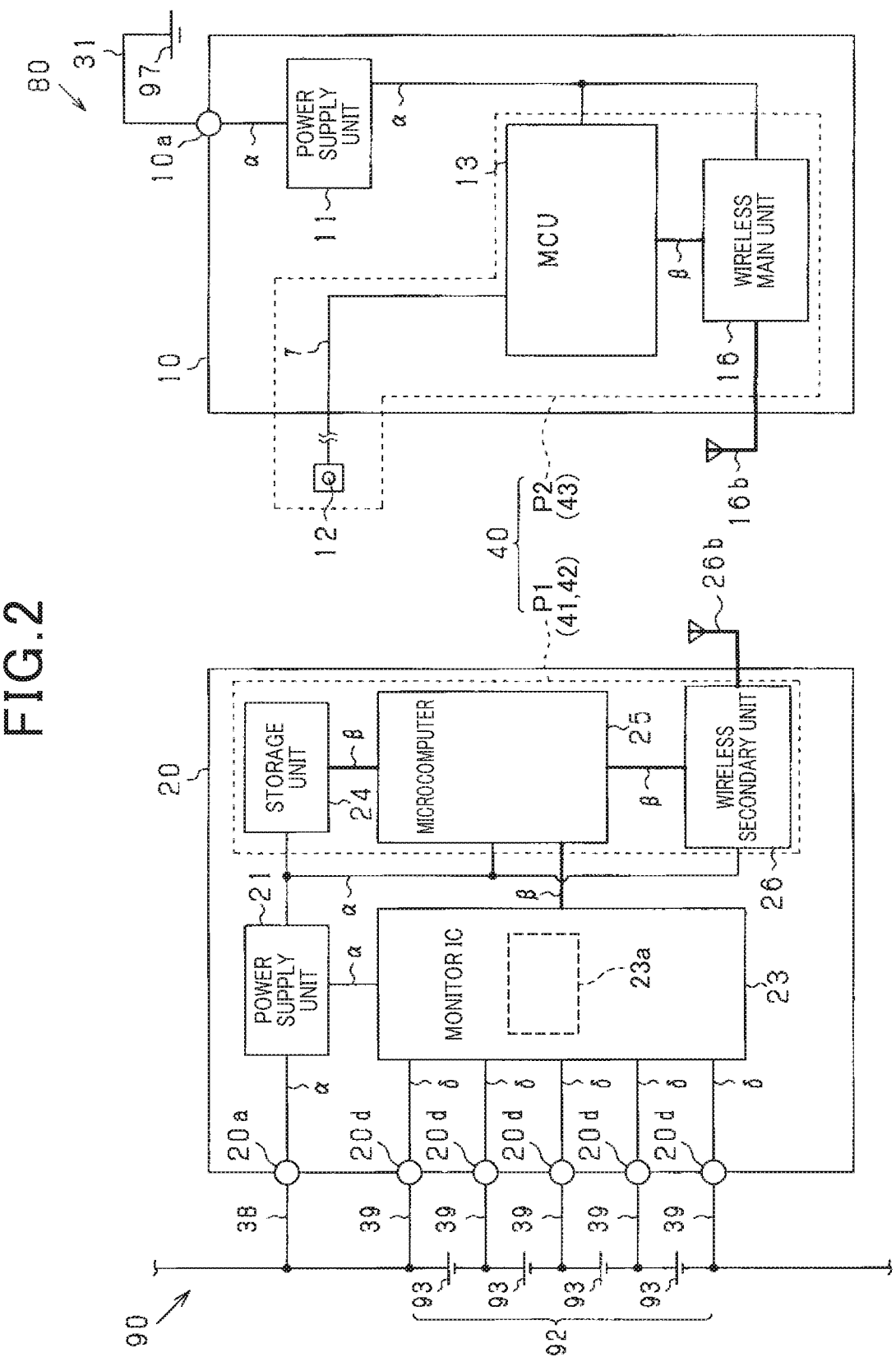
FIG. 2 is an enlarged block diagram schematically illustrating the arrangement configuration between a battery ECU and a selected voltage monitor illustrated in FIG. 1, and an example of a circuit diagram of each of the battery ECU and the selected voltage monitor.

FIG. 2 is an enlarged block diagram schematically illustrating (1) The arrangement configuration between the battery ECU 10 and a selected one of the voltage monitors 20 provided for a selected one of the battery groups 92

(2) An example of the circuit diagram of each of the battery ECU 10 and the selected one of the voltage monitors 20

Note that each of the voltage monitors 20 has a common configuration.

Referring to FIGS. 1 and 2, each voltage monitor 20 is comprised of a power supply unit 21, a monitor integrated circuit (IC) 23, a storage unit 24, a microcomputer 25, and a wireless secondary unit 26 as an example of a wireless communication unit. Each voltage monitor 20 is also comprised of a power supply port 20a, measurement ports 20d, electrical wirings α, communication wirings β, and measurement wirings δ. The wireless secondary unit 26 has a transceiver antenna 26b.

A first processor unit P1 installed in each voltage monitor 20 includes the storage unit 24, the microcomputer 25, and the wireless secondary unit 26, and the first processor unit P1 installed in each voltage monitor 20 includes the assignment unit 41 and the measuring unit 42 as functional blocks included in various functional modules. The first processor unit P1 can be comprised of (1) A combination of at least one programmed processing unit, i.e. at least one programmed logic circuit, and at least one memory including software that causes the at least one programmed logic circuit to implement all the functional modules (2) At least one hardwired logic circuit that implements all the functional modules (3) At least one hardwired-logic and programmed-logic hybrid circuit that implements all the functional modules The battery ECU 10 is comprised of a power supply unit 11, a sending request switch 12, a micro control unit (MCU) 13, and a wireless main unit 16 as an example of a wireless communication unit. The battery ECU 10 is also comprised of a power supply port 10a, electrical wirings α, communication wirings β, and a signal wiring γ. The wireless main unit 16 has a transceiver antenna 16b.

The battery ECU 10 includes the sending request switch 12, the MCU 13, and the wireless main unit 16, and the battery ECU 10 includes the comparison unit 43 as a functional module included in various functional modules. The battery ECU 10 can be comprised of (1) A combination of at least one programmed processing unit, i.e. at least one programmed logic circuit, and at least one memory including software that causes the at least one programmed logic circuit to implement all the functional modules (2) At least one hardwired logic circuit that implements all the functional modules (3) At least one hardwired-logic and programmed-logic hybrid circuit that implements all the functional modules Next, the following describes in detail each component of the battery monitor apparatus 80 as described above.

Note that each of the battery groups 92, which is comprised of the four battery cells 93 connected in series to each other, has a first end point, i.e. a positive end point, and a second end point, i.e. a negative end point. In other words, the series-connected battery cells 93 of each battery group 92 have the first end point and the second end point. Specifically, as illustrated in FIG. 1, the first end point of the battery group 92A is connected to the second end point of the battery group 92B, the first end point of the battery group 92B is connected to the second end point of the battery group 92C, and the first end point of the battery group 92C is connected to the second end point of the battery group 92D.

The power supply port 20a of each voltage monitor 20 is connected to the first end point of the corresponding battery group 92 via the corresponding power supply line 38. The power supply unit 21 of each voltage monitor 20 is connected to the power supply port 20a, monitor IC 23, storage unit 24, microcomputer 25, and wireless secondary unit 26 via the respective power supply wirings α.

The power supply unit 21 of each voltage monitor 20 is configured to receive electrical power supplied from the corresponding battery group 92 via the power supply line 38, and supply the received electrical power supplied from the corresponding battery group 92 to each of the monitor IC 23, storage unit 24, microcomputer 25, and wireless secondary unit 26 via the corresponding one of the power supply wirings α.

The microcomputer 25 is communicably connected to the monitor IC 23, storage unit 24, and wireless secondary unit 26 via the respective communication wirings β. The microcomputer 25 of each voltage monitor 20 is capable of obtaining temperature information about each battery cell 93 included in the corresponding battery group 92; the temperature information about each battery cell 93 represents a parameter indicative of the temperature of the corresponding battery cell 93. The temperature of each battery cell 93 is measured by an unillustrated temperature sensor provided for the corresponding battery cell 93.

The monitor IC 23 of each voltage monitor 20 for example includes a multiplexer 23a. The multiplexer 23a is connected to the measurement ports 20d via the respective measurement wirings δ.

If N battery cells 93 are connected in series to one another in each battery group 92, the series-connected battery cells 93 of each battery group 92 have the first end point (positive end point), (N−1) connection points, and the second end point (negative end point); each of the (N−1) connection points represents a connect point of a corresponding adjacent pair of the N battery cells 93 (N is an integer equal to or more than 2). The first end point, (N−1) end points, and second end point of the series-connected battery cells 93 of each battery group 92 will be collectively referred to as terminal points.

At that time, the measurement ports 20d, which are connected to the multiplexer 23a, of each voltage monitor 20 are respectively connected to the respective terminal points of the series-connected battery cells 93 of the corresponding battery group 92.

For example, the multiplexer 23a includes a selection switch provided for each battery cell 93; the selection switch provided for each battery cell 93 is connected to the corresponding measurement wiring δ connected to the positive terminal of the corresponding battery cell 93.

This connection configuration enables the multiplexer 23a of each voltage monitor 20 to control on-off switching operations of the selection switches provided for the respective battery cells 93 to thereby sequentially or selectively measure items of voltage information across the respective battery cells 93 of the corresponding battery group 92. The voltage information across a battery cell 93 represents a physical parameter associated with a voltage across the battery cell 93, such as the voltage across the battery cell 93 itself, or a predetermined current value that can be converted into the voltage across the battery cell 93.

Additionally, the multiplexer 23a for example includes discharge circuits, each of which has a discharge switch, connected between the positive and negative terminals of the corresponding battery cell 93. This enables the multiplexer 23a to turn on the discharge switch of a selected one of the discharge circuits to thereby enable a selected one of the battery cells 93 to be discharged. That is, the multiplexer 23a, which has the above discharge circuit, makes it possible to perform a balancing function of obtaining a balance among the states of charge (SOC) of the respective battery cells 93, i.e. equalizing the SOC of each battery cell 93.

Note that, in the circuit diagram of the selected voltage monitor 20 in FIG. 2, the power supply port 20a and the measurement ports 20d are illustrated to be separated from each other, but the present disclosure is not limited thereto. Specifically, the battery monitor apparatus 80 can be configured such that these ports 20a and 20d are modularized as a single port module, and the power supply line 38 and measurement lines 39 for each of the voltage monitors 20, which are separated from each other in FIG. 2, can be modularized as a single connector module. In particular, the port module and the connector module can be configured such that 1. One of the port module and the connector module is insertable into the other thereof 2. An insertion of one of the port module and the connector module into the other thereof enables the power supply line 38 and measurement lines 39 to be easily connected to the respective power supply port 20a and measurement ports 20d The power supply port 10a of the battery ECU 10 is connected to the auxiliary battery 97 via the power supply line 31, and also connected to the power supply unit 11 via a corresponding electrical wiring α. The power supply unit 11 is connected to the MCU 13 and wireless main unit 16 via respective electrical wirings α. The auxiliary battery 97 is configured to supply electrical power to the power supply unit 11, and the power supply unit 11 is configured to receive the electrical power supplied from the auxiliary battery 97, and supply the received electrical power to each of the MCU 13 and wireless main unit 16.

The MCU 13 and wireless main unit 16 are communicably connected to each other via a corresponding communication wiring 13, and the sending request switch 12 and MCU 13 are connected to each other via the corresponding signal wiring γ.

Next, the following describes how the battery monitor apparatus 80 monitors the battery pack 90.

The MCU 13 of the battery ECU 10 generates various instructions for the microcomputer 25 of each voltage monitor 20; the various instructions for the microcomputer 25 of each voltage monitor 20 instruct the microcomputer 25 of the corresponding voltage monitor 20 to perform various tasks in accordance with the various instructions. For example, the instructions for the microcomputer 25 of each voltage monitor 20 include 1. An instruction that instructs the microcomputer 25 of each voltage monitor 20 to obtain, from each battery cell 93 of the corresponding battery group 92, battery information about the corresponding battery cell 93, which includes voltage information and temperature information about the corresponding battery cell 93

2. An instruction that instructs the microcomputer 25 of at least one selected voltage monitor 20 to discharge at least one of the battery cells 93 included in the at least one selected voltage monitor 20

The MCU 13 of the battery ECU 10 sends the instructions for the microcomputer 25 of each voltage monitor 20 to the wireless main unit 16 of the battery ECU 10.

The wireless main unit 16 of the battery ECU 10 receives the instructions sent from the MCU 13, and wirelessly transmits the instructions to the wireless secondary unit 26 of each voltage monitor 20 via the transceiver antenna 16b.

The wireless secondary unit 26 of each voltage monitor 20 receives the instructions sent wirelessly transmitted from the wireless main unit 16 of the battery ECU 10 to the corresponding voltage monitor 20 via the transceiver antenna 26b. Then, the wireless secondary unit 26 of each voltage monitor 20 sends the received instructions to the microcomputer 25 of the corresponding voltage monitor 20.

The microcomputer 25 of each voltage monitor 20 sends, to the monitor IC 23, control signals in accordance with the received instructions to thereby control the monitor IC 23 such that the monitor IC 23 performs, for example, at least one of 1. A first task of obtaining, from each battery cell 93 of the corresponding battery group 92, battery information about the corresponding battery cell 93, which includes voltage information and temperature information about the corresponding battery cell 93

2. A second task of obtaining, from the unillustrated temperature sensor provided for each battery cell 93 included in the corresponding voltage monitor 20, the temperature information about the corresponding battery cell 93

3. A second task of discharging at least one of the battery cells 93 included in the corresponding voltage monitor 20

If need arises, the microcomputer 25 of each voltage monitor 20 sends, to the storage unit 24, various information obtained thereby, thus storing the various information in the storage unit 24. The microcomputer 25 of each voltage monitor 20 is also capable of reading, from the storage unit 24, various information stored in the storage unit 24.

If the control signals received by the monitor IC 23 of each voltage monitor 20 include a request of the first task, the monitor IC 23 of the corresponding voltage monitor 20 performs the first task to thereby obtain the battery information about each battery cell 93 included in the corresponding battery group 92. Similarly, if the control signals received by the monitor IC 23 of each voltage monitor 20 include a request of the second task, the monitor IC 23 of the corresponding voltage monitor 20 performs the second task to thereby obtain the temperature information about each battery cell 93 included in the corresponding battery group 92.

Then, the monitor IC 23 of each voltage monitor 20 sends, to the microcomputer 25, the battery information about each battery cell 93 included in the corresponding battery group 92; the battery information includes at least one of the voltage information and the temperature information about the corresponding battery cell 93.

The wireless secondary unit 26 of each voltage monitor 20 receives the battery information about each battery cell 93 included in the corresponding battery group 92 sent from the microcomputer 25, and wirelessly transmits the battery information about each battery cell 93 included in the corresponding battery group 92 to the wireless main unit 16 of the battery ECU 10 via the transceiver antenna 26b.

The wireless main unit 16 of the battery ECU 10 receives the battery information wirelessly transmitted from the wireless secondary unit 26 of each voltage monitor 20 via the transceiver antenna 16b, and sends the battery information for each voltage monitor 20 to the MCU 13 of the battery ECU 10. This enables the MCU 13 to obtain the battery information across each battery cell 93 included in the battery pack 90.

Next, the following describes how the ID assignment system 40 works according to the first embodiment.

In addition, the sending request switch 12, the MCU 13, and the wireless main unit 16 installed in the battery ECU 10 serve as the comparison unit 43.

When the measuring unit 42 of each voltage monitor 20 is activated based on the electrical power supplied from the corresponding battery group 92, the microcomputer 25 of the corresponding measuring unit 42 starts to measure elapsed time information indicative of an elapsed time t that has elapsed since a predetermined point of time after the activation of the corresponding voltage monitor 20.

Note that the elapsed time information indicative of the elapsed time t since the activation of the corresponding voltage monitor 20 will be referred to simply as an elapsed time t. In addition, the predetermined point of time after the activation of the corresponding voltage monitor 20 can be preferably set to a point of time immediately after, i.e. immediately in response to, the activation of the corresponding voltage monitor 20, or can be set to be within several seconds after the activation of the corresponding voltage monitor 20.

The sending request switch 12 is designed as a push-button switch. That is, the sending request switch 12 is configured to be 1. Turned on when being pushed by a user or worker while the switch 12 is in an off state to thereby send a sending request signal to the MCU 13 via the signal wiring γ

2. Turned off when being pushed by a user or worker while the switch 12 is in an on state to thereby stop sending of the sending request signal to the MCU 13

In response to receiving the sending request from the sending request switch 12, the MCU 13 sends a sending request to the wireless main unit 16. In response to receiving the sending request from the MCU 13, the wireless main unit 16 wirelessly transmits the sending request to the wireless secondary unit 26 of each voltage monitor 20.

In response to receiving the sending request from the wireless main unit 16, the wireless secondary unit 26 of each voltage monitor 20 sends the sending request to the microcomputer 25 of the corresponding voltage monitor 20.

When receiving the sending request from the wireless secondary unit 26 of each voltage monitor 20, the microcomputer 25 of the corresponding voltage monitor 20 stops the measurement of the elapsed time t, and sends a present value of the elapsed time t at the stop of the measurement to the storage unit 24 and wireless secondary unit 26 of the corresponding voltage monitor 20. The storage unit 24 of each voltage monitor 20 stores the elapsed time t of the corresponding voltage monitor 20, and the wireless secondary unit 26 of each voltage monitor 20 wirelessly transmits the measured value of the elapsed time t of the corresponding voltage monitor 20 to the wireless main unit 16 of the battery ECU 10 via the transceiver antenna 26b.

The wireless main unit 16 of the battery ECU 10 receives the elapsed time t of each voltage monitor 20 transmitted from the wireless secondary unit 26 of the corresponding voltage monitor 20, and sends the elapsed time t of each voltage monitor 20 to the MCU 13.

In response to receiving the elapsed time t of each voltage monitor 20, the MCU 13 compares the elapsed times t of the respective voltage monitors 20 with one another to thereby determine that, the longer the elapsed time t of a selected voltage monitor 20, the earlier the selected voltage monitor 20 is connected to the corresponding battery group 92. In other words, the MCU 13 sorts the voltage monitors 20 in descending order of their elapsed times t, thus obtaining a battery-connection order of the voltage monitors 20; the battery-connection order of the voltage monitors 20 represents a descending time order from the earliest voltage monitor 20 connected to the corresponding battery group 92.

Then, the MCU 13 links, based on the battery-connection order of the voltage monitors 20, unique identifiers (IDs) to the respective voltage monitors 20.

For example, four IDs, which consist of, for example, 1, 2, 3, and 4, are prepared for the respective four voltage monitors 20.

That is, the MCU 13 is configured to link

1. The first ID of 1 to a selected voltage monitor 20; the selected voltage monitor 20 has the earliest monitor connected to the corresponding battery group 92

2. The second ID of 2 to a selected voltage monitor 20; the selected voltage monitor 20 has the second earliest monitor connected to the corresponding battery group 92

3. The third ID of 3 to a selected voltage monitor 20; the selected voltage monitor 20 has the third earliest monitor connected to the corresponding battery group 92

4. The fourth ID of 4 to a selected voltage monitor 20; the selected voltage monitor 20 has the fourth earliest monitor, i.e. the latest monitor, connected to the corresponding battery group 92

For example, if the voltage monitor 20 corresponding to the first battery group 92A is the earliest monitor connected to the corresponding first battery group 92A, the MCU 13 links the first ID of 1 to the voltage monitor 20 corresponding to the first battery group 92A. If the voltage monitor 20 corresponding to the second battery group 92B is the second earliest monitor connected to the corresponding second battery group 92B, the MCU 13 links the second ID of 2 to the voltage monitor 20 corresponding to the second battery group 92B.

If the voltage monitor 20 corresponding to the third battery group 92C is the third earliest monitor connected to the corresponding third battery group 92C, the MCU 13 links the third ID of 3 to the voltage monitor 20 corresponding to the third battery group 92C. If the voltage monitor 20 corresponding to the fourth battery group 92D is the fourth earliest monitor connected to the corresponding fourth battery group 92D, the MCU 13 links the fourth ID of 4 to the voltage monitor 20 corresponding to the fourth battery group 92D.

More specifically, the MCU 13 compares the elapsed times t of the voltage monitors 20 with one another. In accordance with the comparison result, the MCU 13 performs a linking task of 1. Linking the first ID of 1 to one of the elapsed times t, which is the longest, i.e. largest, in all the elapsed times t 2. Linking the second ID of 2 to one of the elapsed times t, which is the second longest, i.e. second largest, in all the elapsed times t 3. Linking the third ID of 3 to one of the elapsed times t, which is the third longest, i.e. third largest, in all the elapsed times t 4. Linking the fourth ID of 4 to one of the elapsed times t, which is the fourth longest or largest, i.e. the shortest or smallest, in all the elapsed times t Hereinafter, information on each of the elapsed times t, to which a corresponding one of the IDs has been linked, will be referred to as ID information.

Thereafter, the MCU 13 sends the ID information for each voltage monitor 20 to the wireless main unit 16. The wireless main unit 16 wirelessly transmits the ID information for each voltage monitor 20 to the wireless secondary unit 26 of the corresponding one of the voltage monitors 20. The wireless secondary unit 16 of each voltage monitor 20 receives the ID information for the corresponding voltage monitor 20, and sends the ID information for the corresponding voltage monitor 20 to the microcomputer 25.

The microcomputer 25 of each voltage monitor 20 receives the ID information for the corresponding voltage monitor 20, and compares the elapsed time t included in the received ID information for the corresponding voltage monitor 20 with the elapsed time t stored in the storage unit 24 of the corresponding voltage monitor 20. Then, the microcomputer 25 of each voltage monitor 20 assigns the ID linked to the received ID information to the corresponding voltage monitor 20 upon determining that the elapsed time t included in the received ID information for the corresponding voltage monitor 20 coincides with the elapsed time t stored in the storage unit 24 of the corresponding voltage monitor 20.

Figure 3:
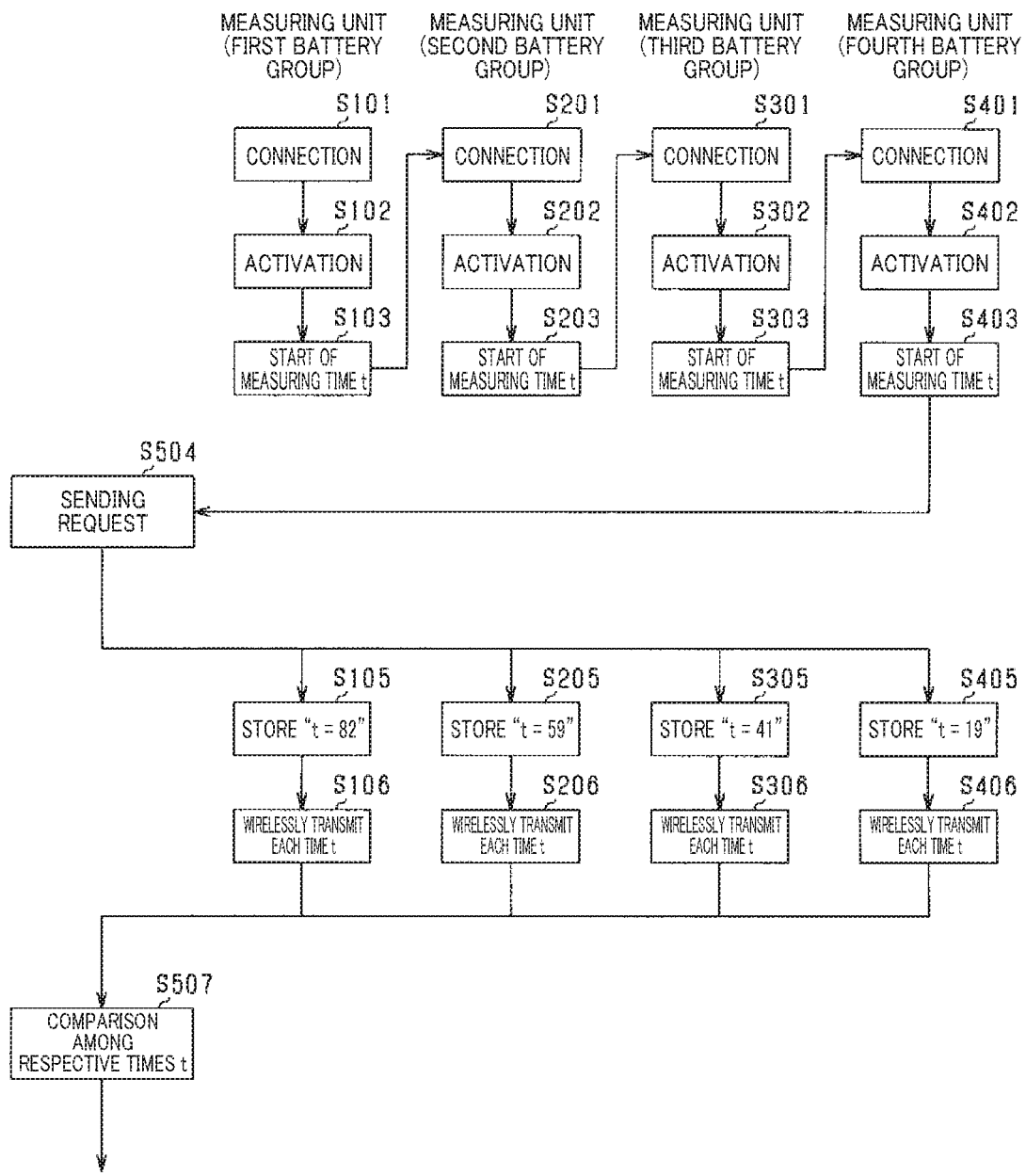
FIG. 3 is a flowchart schematically illustrating a first half of an assignment routine carried out by an ID assignment system illustrated in each of FIGS. 1 and 2.
Figure 4:
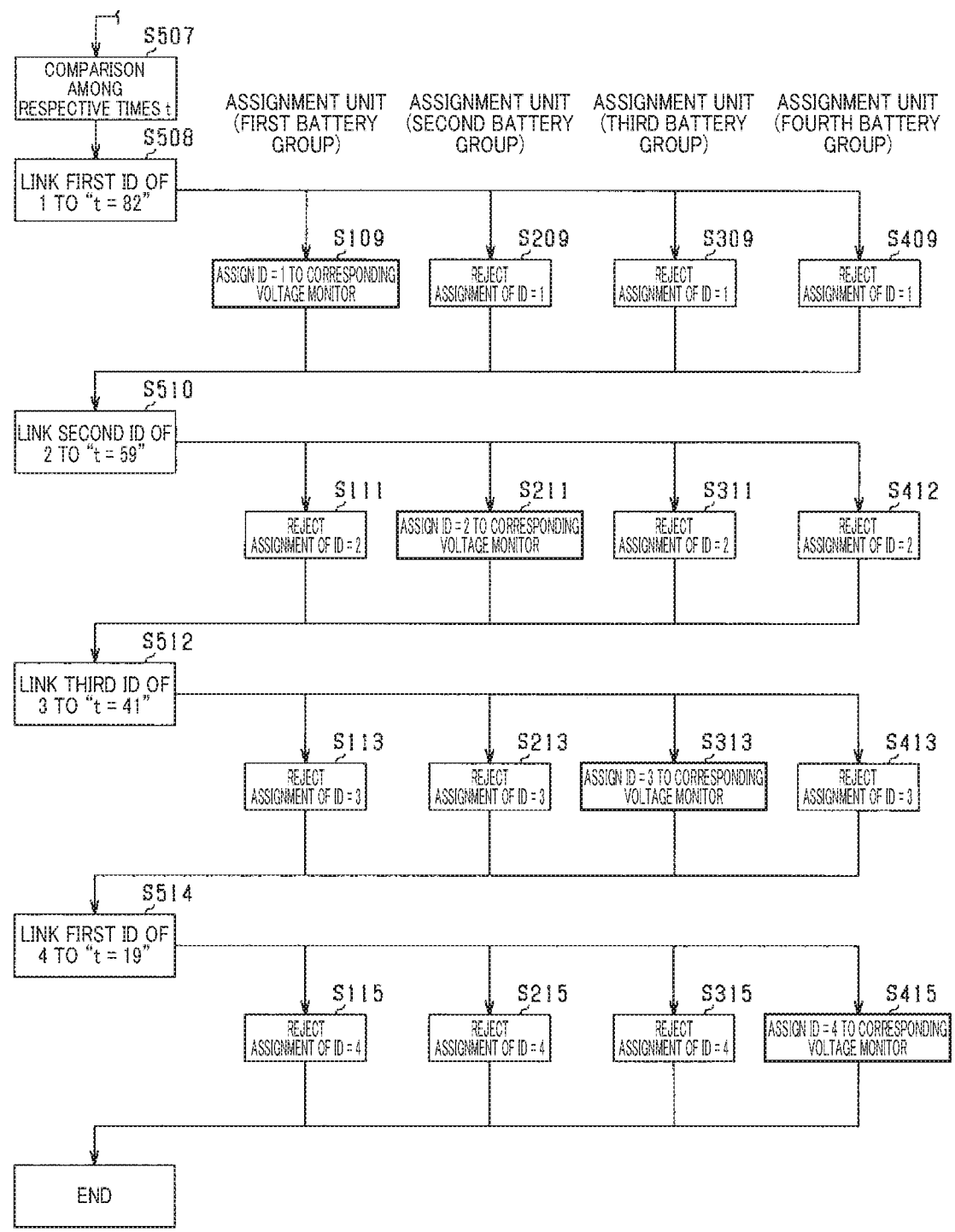
FIG. 4 is a flowchart schematically illustrating a second half of the assignment routine carried out by the ID assignment system illustrated in each of FIGS. 1 and 2.

FIG. 3 schematically illustrates a first half of an assignment routine carried out by the ID assignment system 40; the first half of the assignment routine includes a step carried out by, for example, a worker.

First, a worker connects one of the four voltage monitors 20 to the first battery group 92A in step S101, and the voltage monitor 20 connected to the first battery group 92A is activated based on electrical power supplied from the first battery group 92A in step S102. In response to activation of the corresponding voltage monitor 20, the measuring unit 42 of the corresponding voltage monitor 20 for the first battery group 92A starts to measure the elapsed time t in step S103.

Next, a worker connects one of the remaining three voltage monitors 20 to the second battery group 92B in step S201, and the voltage monitor 20 connected to the second battery group 92B is activated based on electrical power supplied from the second battery group 92B in step S202. In response to activation of the corresponding voltage monitor 20, the measuring unit 42 of the corresponding voltage monitor 20 for the second battery group 92B starts to measure the elapsed time t in step S203.

Subsequently, a worker connects one of the remaining two voltage monitors 20 to the third battery group 92C in step S301, and the voltage monitor 20 connected to the third battery group 92C is activated based on electrical power supplied from the third battery group 92C in step S302. In response to activation of the corresponding voltage monitor 20, the measuring unit 42 of the corresponding voltage monitor 20 for the third battery group 92C starts to measure the elapsed time t in step S303.

Following the connection of the voltage monitor 20 to the third battery group 92C, a worker connects the last voltage monitor 20 to the fourth battery group 92D in step S401, and the voltage monitor 20 connected to the fourth battery group 92D is activated based on electrical power supplied from the fourth battery group 92D in step S402. In response to activation of the corresponding voltage monitor 20, the measuring unit 42 of the corresponding voltage monitor 20 for the fourth battery group 92D starts to measure the elapsed time t in step S403.

After completion of the connection of all the battery monitors 20 to the respective battery groups 92, a worker pushes the sending request switch 12, so that the sending request switch 12 is turned on. This causes the comparison unit 43, i.e. the set of the sending request switch 12, MCU 13, and wireless main unit 16, to wirelessly transmit the sending request signal to the measuring unit 42 of each voltage monitor 20 in step S504.

In response to wirelessly receiving the sending request signal, the measuring unit 42 of each voltage monitor 20 stops the measurement of the elapsed time t, and stores a present value of the elapsed time t at the stop of the measurement in the storage unit 24 in steps S105, S205, S305, and S405.

The first embodiment assumes that

1. The present value of the elapsed time t for the first battery group 92A at the stop of the measurement is set to 82 seconds (t=82 (s))

2. The present value of the elapsed time t for the second battery group 92A at the stop of the measurement is set to 59 seconds (t=52 (s))

3. The present value of the elapsed time t for the third battery group 92C at the stop of the measurement is set to 41 seconds (t=41 (s))

4. The present value of the elapsed time t for the fourth battery group 92D at the stop of the measurement is set to 19 seconds (t=19 (s))

That is, the measuring unit 42 of the voltage monitor 20 for the first battery group 92A stores the present value 82 (s) of the elapsed time t at the stop of the measurement in the storage unit 24 as the elapsed time t=82 (s) in step S105, and the measuring unit 42 of the voltage monitor 20 for the second battery group 92B stores the present value 59 (s) of the elapsed time t at the stop of the measurement in the storage unit 24 as the elapsed time t=59 (s) in step S205.

Similarly, the measuring unit 42 of the voltage monitor 20 for the third battery group 92C stores the present value 41 (s) of the elapsed time t at the stop of the measurement in the storage unit 24 as the elapsed time t=41 (s) in step S305, and the measuring unit 42 of the voltage monitor 20 for the fourth battery group 92D stores the present value 19 (s) of the elapsed time t at the stop of the measurement in the storage unit 24 as the elapsed time t=19 (s) in step S405.

In addition, the measuring unit 42 of the voltage monitor 20 for the first battery group 92A wirelessly transmits the elapsed time t=82 (s) to the assignment unit 41 in step S106, and the measuring unit 42 of the voltage monitor 20 for the second battery group 92B wirelessly transmits the elapsed time t=59 (s) to the comparison unit 43 in step S206.

Similarly, the measuring unit 42 of the voltage monitor 20 for the third battery group 92C wirelessly transmits the elapsed time t=41 (s) to the assignment unit 41 in step S306, and the measuring unit 42 of the voltage monitor 20 for the fourth battery group 92D wirelessly transmits the elapsed time t=19 (s) to the comparison unit 43 in step S406.

FIG. 3 schematically illustrates a second half of the assignment routine carried out by the ID assignment system 40.

In response to receiving the elapsed times t=82 (s), t=59 (s), t=41 (s), and t=19 (s) transmitted from the respective voltage monitors 20, the comparison unit 43 compares the elapsed times t=82 (s), t=59 (s), t=41 (s), and t=19 (s) with one another in step S507. The comparison unit 43 extracts, from all the elapsed times t, the elapsed time t=82 (s), which is the longest, and links the first ID of 1 to the extracted elapsed time t=82 (s) in step S508.

Then, the comparison unit 43 wirelessly transmits, to the assignment unit 41 of each voltage monitor 20, the ID information including the elapsed time t=82 (s) linked to the first ID of 1 in step S508.

In response to receiving the ID information including the elapsed time t=82 (s) linked to the first ID of 1, the assignment unit 41 of each voltage monitor 20 compares the received elapsed time t=82 (s) with the elapsed time t stored in the storage unit 24 of the corresponding voltage monitor 20 in a corresponding one of steps S109, S209, S309, and S409.

Then, the assignment unit 41 of one of the voltage monitors 20 assigns the first ID of 1, which is linked to the received elapsed time t=82 (s), to the corresponding voltage monitor 20 upon determining that the received elapsed time t=82 (s) agrees with the elapsed time t stored in the storage unit 24 in a corresponding one of steps S109, S209, S309, and S409.

Otherwise, the assignment unit 41 of each of the other voltage monitors 20 rejects assignment of the first ID of 1, which is linked to the received elapsed time t=82 (s), to the corresponding voltage monitor 20 upon determining that the received elapsed time t=82 (s) disagrees with the elapsed time t stored in the storage unit 24 in a corresponding one of steps S109, S209, S309, and S409.

Specifically, because the received elapsed time t=82 (s) agrees with the elapsed time t stored in the storage unit 24 of the voltage monitor 20 for the first battery group 92A, the assignment unit 41 of the voltage monitor 20 for the first battery group 92A assigns the first ID of 1, which is linked to the received elapsed time t=82 (s), to the corresponding voltage monitor 20 in step S109.

Otherwise, because the received elapsed time t=82 (s) disagrees with the elapsed time t stored in the storage unit 24 of each of the other voltage monitors 20 for the respective second, third, and fourth battery groups 92B, 92C, and 92D, the assignment unit 41 of each of the other voltage monitors 20 rejects assignment of the first ID of 1, which is linked to the received elapsed time t=82 (s), to the corresponding voltage monitor 20 in a corresponding one of steps S209, S309, and S409.

Next, the comparison unit 43 extracts, from all the elapsed times t, the elapsed time t=59 (s), which is the second longest, and links the second ID of 2 to the extracted elapsed time t=59 (s) in step S510.

Then, the comparison unit 43 wirelessly transmits, to the assignment unit 41 of each voltage monitor 20, the ID information including the elapsed time t=59 (s) linked to the second ID of 2 in step S510.

In response to receiving the ID information including the elapsed time t=59 (s) linked to the second ID of 2, the assignment unit 41 of each voltage monitor 20 compares the received elapsed time t=59 (s) with the elapsed time t stored in the storage unit 24 of the corresponding voltage monitor 20 in a corresponding one of steps S111, S211, S311, and S411.

Then, the assignment unit 41 of one of the voltage monitors 20 assigns the second ID of 2, which is linked to the received elapsed time t=59 (s), to the corresponding voltage monitor 20 upon determining that the received elapsed time t=59 (s) agrees with the elapsed time t stored in the storage unit 24 in a corresponding one of steps S111, S211, S311, and S411.

Otherwise, the assignment unit 41 of each of the other voltage monitors 20 rejects assignment of the second ID of 2, which is linked to the received elapsed time t=59 (s), to the corresponding voltage monitor 20 upon determining that the received elapsed time t=59 (s) disagrees with the elapsed time t stored in the storage unit 24 in a corresponding one of steps S111, S211, S311, and S411.

Specifically, because the received elapsed time t=59 (s) agrees with the elapsed time t stored in the storage unit 24 of the voltage monitor 20 for the second battery group 92B, the assignment unit 41 of the voltage monitor 20 for the second battery group 92B assigns the second ID of 2, which is linked to the received elapsed time t=59 (s), to the corresponding voltage monitor 20 in step S211.

Otherwise, because the received elapsed time t=59 (s) disagrees with the elapsed time t stored in the storage unit 24 of each of the other voltage monitors 20 for the respective first, third, and fourth battery groups 92A, 92C, and 92D, the assignment unit 41 of each of the other voltage monitors 20 rejects assignment of the second ID of 2, which is linked to the received elapsed time t=59 (s), to the corresponding voltage monitor 20 in a corresponding one of steps S111, S311, and S411.

Subsequently, the comparison unit 43 extracts, from all the elapsed times t, the elapsed time t=41 (s), which is the third longest, and links the third ID of 3 to the extracted elapsed time t=41 (s) in step S512.

Then, the comparison unit 43 wirelessly transmits, to the assignment unit 41 of each voltage monitor 20, the ID information including the elapsed time t=41 (s) linked to the third ID of 3 in step S512.

In response to receiving the ID information including the elapsed time t=41 (s) linked to the second ID of 3, the assignment unit 41 of each voltage monitor 20 compares the received elapsed time t=41 (s) with the elapsed time t stored in the storage unit 24 of the corresponding voltage monitor 20 in a corresponding one of steps S113, S213, S313, and S413.

Then, the assignment unit 41 of one of the voltage monitors 20 assigns the third ID of 3, which is linked to the received elapsed time t=41 (s), to the corresponding voltage monitor 20 upon determining that the received elapsed time t=41 (s) agrees with the elapsed time t stored in the storage unit 24 in a corresponding one of steps S113, S213, S313, and S413.

Otherwise, the assignment unit 41 of each of the other voltage monitors 20 rejects assignment of the third ID of 3, which is linked to the received elapsed time t=41 (s), to the corresponding voltage monitor 20 upon determining that the received elapsed time t=41 (s) disagrees with the elapsed time t stored in the storage unit 24 in a corresponding one of steps S113, S213, S313, and S413.

Specifically, because the received elapsed time t=41 (s) agrees with the elapsed time t stored in the storage unit 24 of the voltage monitor 20 for the third battery group 92C, the assignment unit 41 of the voltage monitor 20 for the third battery group 92C assigns the third ID of 3, which is linked to the received elapsed time t=41 (s), to the corresponding voltage monitor 20 in step S313.

Otherwise, because the received elapsed time t=41 (s) disagrees with the elapsed time t stored in the storage unit 24 of each of the other voltage monitors 20 for the respective first, second, and fourth battery groups 92A, 92B, and 92D, the assignment unit 41 of each of the other voltage monitors 20 rejects assignment of the third ID of 3, which is linked to the received elapsed time t=41 (s), to the corresponding voltage monitor 20 in a corresponding one of steps S113, S213, and S413.

Next, the comparison unit 43 extracts, from all the elapsed times t, the elapsed time t=19 (s), which is the fourth longest, in other words, shortest, and links the fourth ID of 4 to the extracted elapsed time t=19 (s) in step S514.

Then, the comparison unit 43 wirelessly transmits, to the assignment unit 41 of each voltage monitor 20, the ID information including the elapsed time t=19 (s) linked to the fourth ID of 4 in step S514.

In response to receiving the ID information including the elapsed time t=19 (s) linked to the fourth ID of 4, the assignment unit 41 of each voltage monitor 20 compares the received elapsed time t=19 (s) with the elapsed time t stored in the storage unit 24 of the corresponding voltage monitor 20 in a corresponding one of steps S115, S215, S315, and S415.

Then, the assignment unit 41 of one of the voltage monitors 20 assigns the fourth ID of 4, which is linked to the received elapsed time t=19 (s), to the corresponding voltage monitor 20 upon determining that the received elapsed time t=19 (s) agrees with the elapsed time t stored in the storage unit 24 in a corresponding one of steps S115, S215, S315, and S415.

Otherwise, the assignment unit 41 of each of the other voltage monitors 20 rejects assignment of the fourth ID of 4, which is linked to the received elapsed time t=19 (s), to the corresponding voltage monitor 20 upon determining that the received elapsed time t=19 (s) disagrees with the elapsed time t stored in the storage unit 24 in a corresponding one of steps S115, S215, S315, and S415.

Specifically, because the received elapsed time t=19 (s) agrees with the elapsed time t stored in the storage unit 24 of the voltage monitor 20 for the fourth battery group 92D, the assignment unit 41 of the voltage monitor 20 for the fourth battery group 92D assigns the fourth ID of 4, which is linked to the received elapsed time t=19 (s), to the corresponding voltage monitor 20 in step S415.

Otherwise, because the received elapsed time t=19 (s) disagrees with the elapsed time t stored in the storage unit 24 of each of the other voltage monitors 20 for the respective first, second, and third battery groups 92A, 92B, and 92C, the assignment unit 41 of each of the other voltage monitors 20 rejects assignment of the fourth ID of 4, which is linked to the received elapsed time t=19 (s), to the corresponding voltage monitor 20 in a corresponding one of steps S115, S215, and S315.

Thereafter, the assignment routine for assigning the IDs to the respective voltage monitors 20 is terminated.

Figure 5:
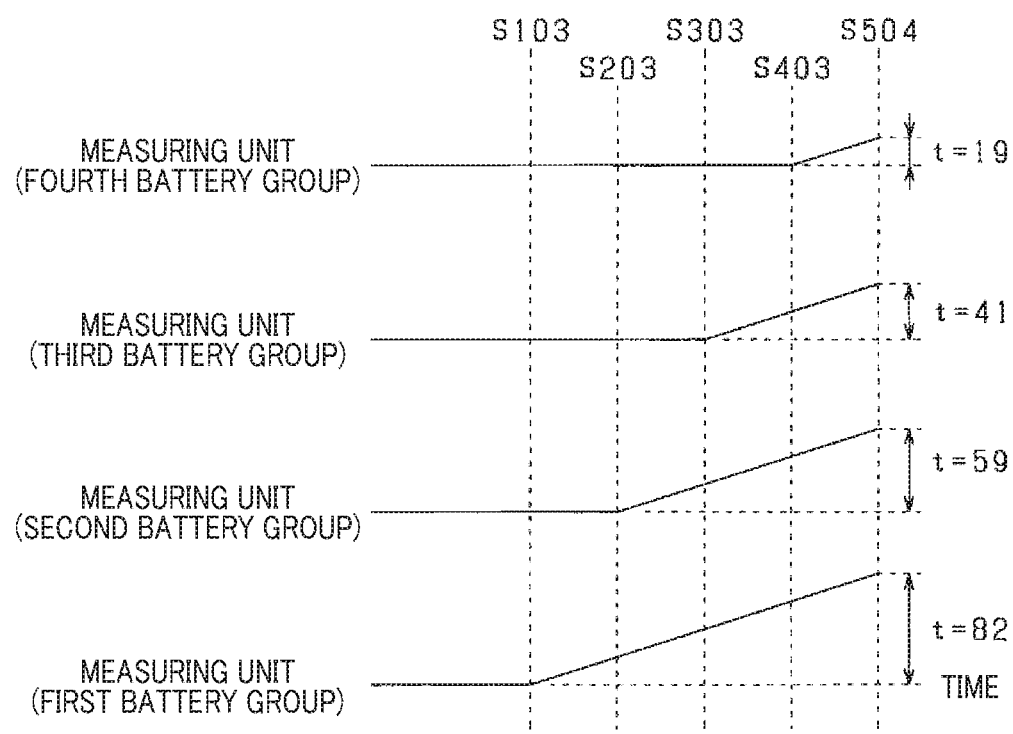
FIG. 5 is a timing chart schematically illustrating how an elapsed time measured by a measuring unit of each voltage monitor is changed over time.

FIG. 5 is a graph schematically illustrating how the elapsed time t measured by the measuring unit 42 of each voltage monitor 20 is changed over time. First, the measuring unit 42 of the voltage monitor 20 for the first battery group 92A starts to measure the elapsed time t in response to activation of the corresponding voltage monitor 20 (see step S103). Next, the measuring unit 42 of the voltage monitor 20 for the second battery group 92B starts to measure the elapsed time t in response to activation of the corresponding voltage monitor 20 (see step S203).

Subsequently, the measuring unit 42 of the voltage monitor 20 for the third battery group 92C starts to measure the elapsed time tin response to activation of the corresponding voltage monitor 20 (see step S303). Following the activation of the voltage monitor 20 for the third battery group 92C, the measuring unit 42 of the voltage monitor 20 for the fourth battery group 92D starts to measure the elapsed time tin response to activation of the corresponding voltage monitor 20 (see step S403).

Thereafter, the comparison unit 43 wirelessly transmits the sending request signal to the measuring unit 42 of each voltage monitor 20 (see step S504).

In response to wirelessly receiving the sending request signal, the measuring unit 42 of each voltage monitor 20 stops the measurement of the elapsed time t, and stores a present value of the elapsed time t at the stop of the measurement in the storage unit 24 (see steps S105, S205, S305, and S405).

Because the measurement time by the measuring unit 42 of the voltage monitor 20 for the first battery group 92A is the longest, the largest elapsed time t of 82 (s) is obtained (see S105). Similarly, because the measurement time by the measuring unit 42 of the voltage monitor 20 for the second battery group 92B is the second longest, the second largest elapsed time t of 59 (s) is obtained (see S205).

Additionally, because the measurement time by the measuring unit 42 of the voltage monitor 20 for the third battery group 92C is the third longest, the third largest elapsed time t of 41 (s) is obtained (see S305). Similarly, because the measurement time by the measuring unit 42 of the voltage monitor 20 for the fourth battery group 92D is the fourth longest, i.e. the shortest, the fourth largest elapsed time t, i.e. the smallest elapsed time t, of 19 (s) is obtained (see S405).

The first embodiment configured above achieves the following benefits.

Specifically, the assigning unit 41 is configured to determine that each voltage monitor 20 corresponding to the elapsed time t is connected to the corresponding battery group 92 earlier as the elapsed time t becomes larger.

Specifically, the assigning unit 41 is configured to

1. Assign the first ID of 1 to the voltage monitor 20 for the first battery group 92A corresponding to the largest elapsed time t 2. Assign the second ID of 2 to the voltage monitor 20 for the second battery group 92B corresponding to the second largest elapsed time t 3. Assign the third ID of 3 to the voltage monitor 20 for the third battery group 92C corresponding to the third largest elapsed time t 4. Assign the fourth ID of 4 to the voltage monitor 20 for the fourth battery group 92D corresponding to the fourth largest elapsed time t A worker's connection work of connecting the voltage monitors 20 to the first to fourth battery groups 92A to 92D in order from the first battery group 92A to the fourth battery group 92D enables the independent first to fourth IDs to be assigned to the respective battery monitors 20 for the first to fourth battery groups 92A to 92D.

Installing the comparison unit 43 in the battery ECU 10 eliminates the need of installing plural comparison units in the respective voltage monitors 20.

The assignment unit 41 of each voltage monitor 20 compares the elapsed time t stored in the storage unit 24 corresponding to the voltage monitor 20 with the received elapsed times t transmitted from the battery ECU 10 to thereby reliably and easily assign a proper ID to the corresponding voltage monitor 20.

A worker's turning on of the sending request switch 12 after completion of connection of all the voltage monitors 20 to the respective battery groups 92 enables both measurement of the elapsed time t to be easily stopped and assignment of IDs to the respective voltage monitors 20 to be easily carried out at a worker's appropriate timing.

Second Embodiment

Figure 6:
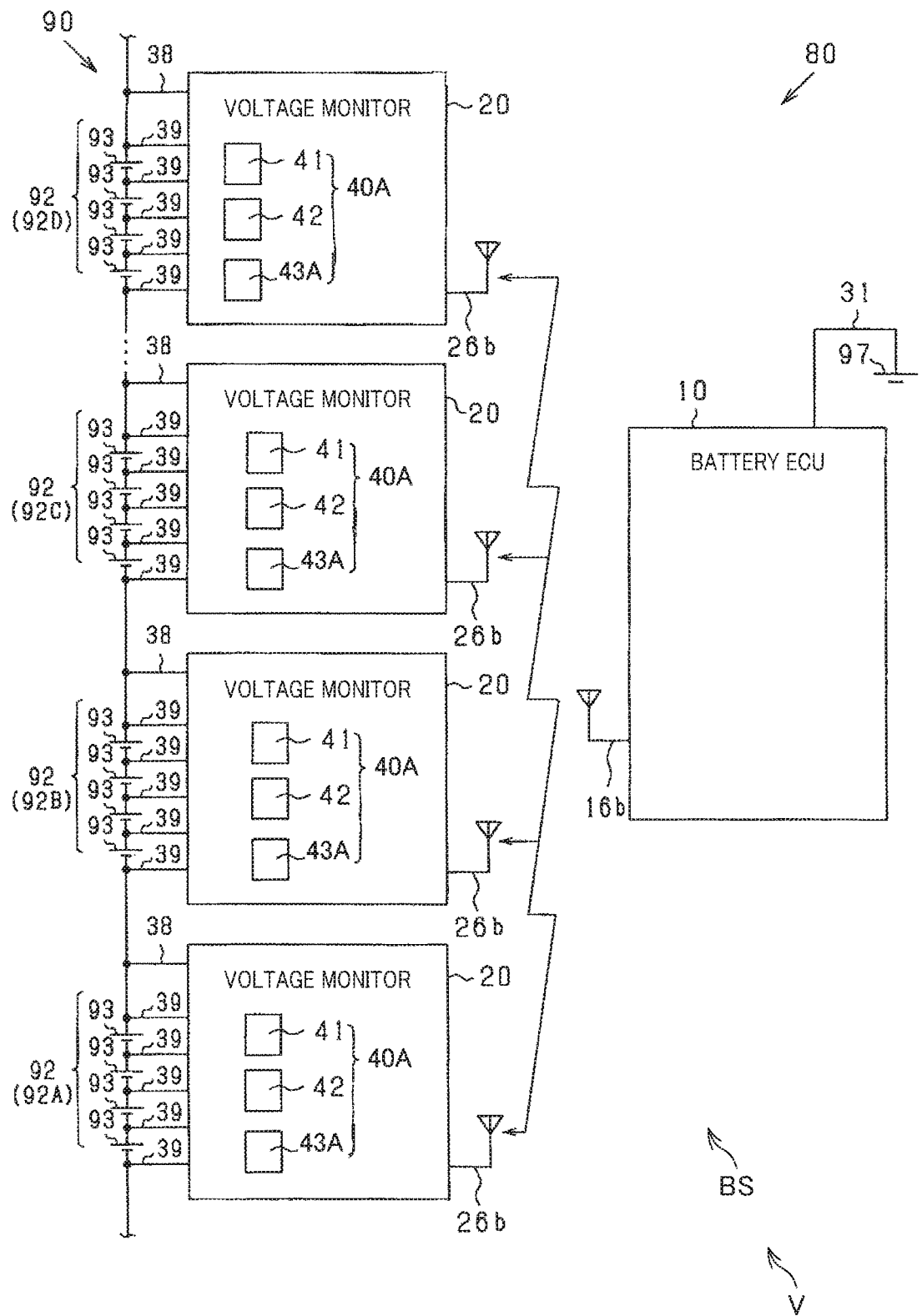
FIG. 6 is a block diagram schematically illustrating an ID assignment system according to the second embodiment of the present disclosure.
Figure 7:
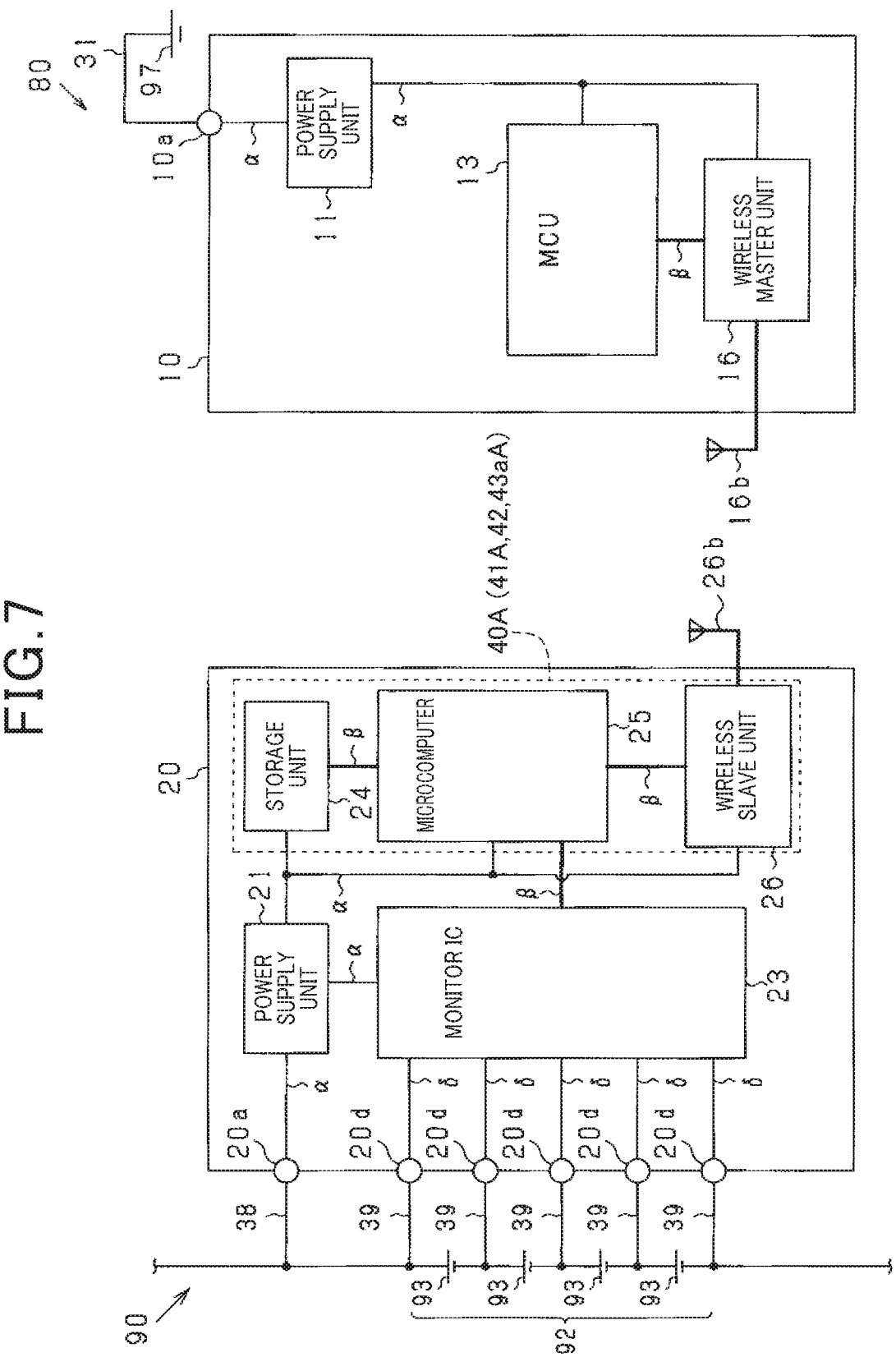
FIG. 7 is an enlarged block diagram schematically illustrating the arrangement configuration between a battery ECU and a selected voltage monitor illustrated in FIG. 6, and an example of a circuit diagram of each of the battery ECU and the selected voltage monitor.
Figure 8:
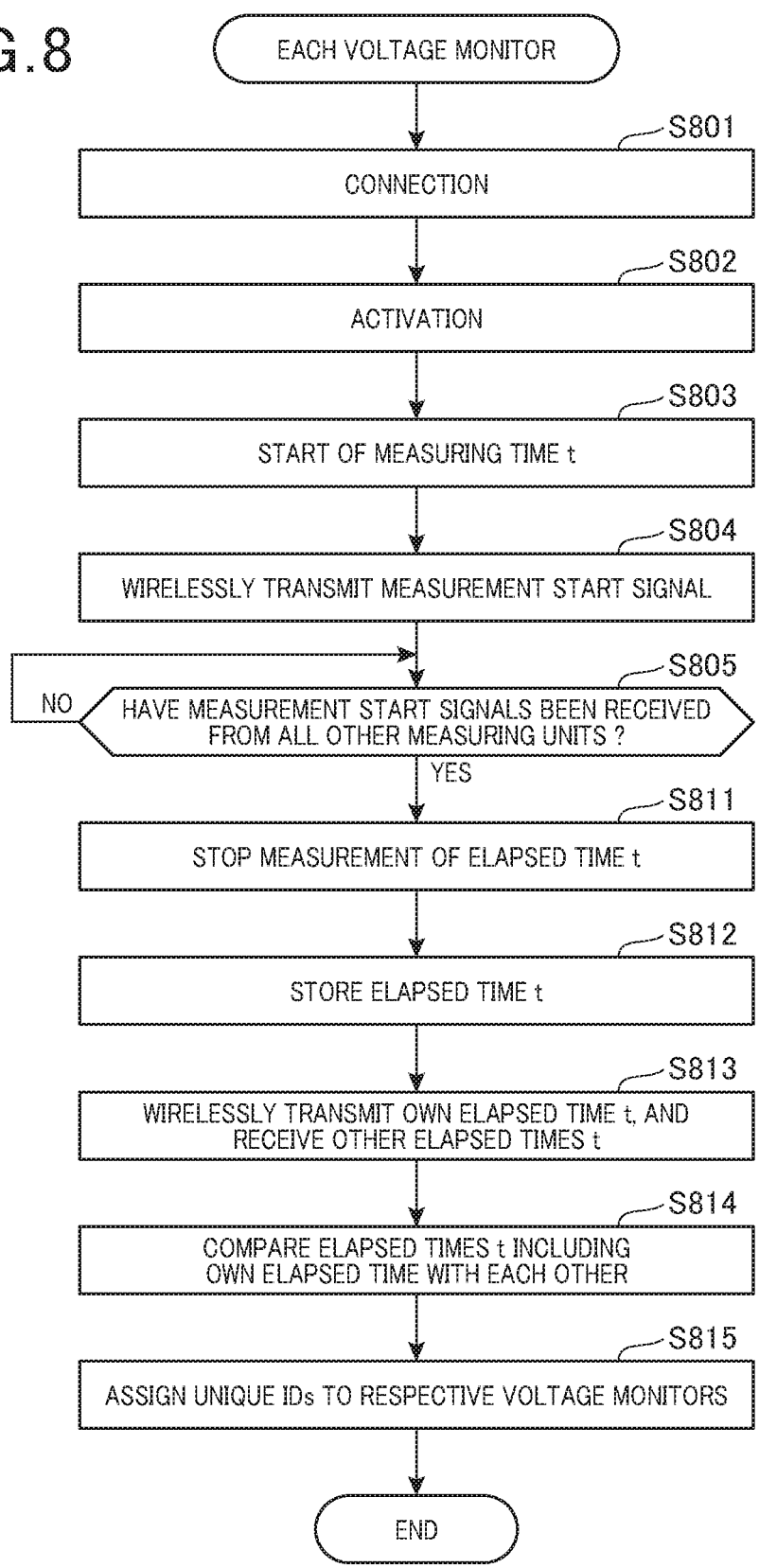
FIG. 8 is a flowchart schematically illustrating an assignment routine carried out by an ID assignment system illustrated in each of FIGS. 6 and 7.

The following describes an ID assignment system 40A according to the second embodiment of the present disclosure with reference to FIGS. 6 to 8. The configuration and functions of the ID assignment system 40A according to the second embodiment are mainly different from those of the ID assignment system 40 according to the first embodiment by the following points. The following therefore mainly describes the different points.

FIG. 6 schematically illustrates a battery system BSA including an ID assignment system 40A and its peripheral configuration according to the first embodiment of the present disclosure.

The ID assignment system 40A includes the assignment units 41, the measuring units 42, and comparison units 43A. That is, no comparison units 43 is installed in a battery ECU 10A, and the comparison units 43 are installed in the respective voltage monitors 20 in addition to the assignment units 41 and measuring units 42. Note that, in FIG. 6, the assignment unit 41, the measuring unit 42, and the comparison unit 43A installed in each voltage monitor 20 are schematically illustrated to be functionally separated from each other, but hardware components of the assignment unit 41, the measuring unit 42, and the comparison unit 43A are at least partly common between each other.

The measuring unit 42 of each voltage monitor 20 has recognized the total number of voltage monitors 20 to be connected to the battery groups 92. The assignment unit 41 of each voltage monitor 20 is configured to assign a corresponding ID to the corresponding voltage monitor 20.

FIG. 7 is an enlarged block diagram schematically illustrating (1) The arrangement configuration between the battery ECU 10 and a selected one of the voltage monitors 20 provided for a selected one of the battery groups 92

(2) An example of the circuit diagram of each of the battery ECU 10 and the selected one of the voltage monitors 20

Note that each of the voltage monitors 20 has a common configuration.

Referring to FIG. 7, the storage unit 24, the microcomputer 25, and the wireless secondary unit 25 installed in each voltage monitor 20 serve as the assignment unit 41, the measuring unit 42, and the comparison unit 43 of the corresponding voltage monitor 20.

Specifically, the ID assignment system 40A includes the assembly of the storage unit 24, the microcomputer 25, and the wireless secondary unit 16 provided in each voltage monitor 20. In other words, each voltage monitor 20 includes the hardware components 24, 25, and 26, and each voltage monitor 20 functionally includes the assignment unit 41, the measuring unit 42, and the comparison unit 43, which are implemented by the hardware components 24, 25, and 26.

As compared with the battery ECU 10 of the first embodiment, the battery ECU 10A has eliminated the sending request switch 12 and the signal wiring γ therefrom FIG. 8 schematically illustrates an assignment routine according to the second embodiment carried out by the ID assignment system 40A; the assignment routine includes a step carried out by, for example, a worker.

First, a worker connects the voltage monitors 20 to the respective first to fourth battery groups 92A to 92D in order from the first battery group 92A to the fourth battery group 92D in step S801. The voltage monitors 20 connected to the respective battery groups 92A to 92D are sequentially activated in order from the first battery group 92A to the fourth battery group 92D in step S802.

In step S803, the measuring unit 42 of the voltage monitor 20 for the first battery group 92A, which is activated the earliest, starts to measure the elapsed time t, and the measuring unit 42 of the voltage monitor 20 for the second battery group 92B, which is activated the second earliest, starts to measure the elapsed time t after lapse of a predetermined time since the first start of measurement.

In step S803, the measuring unit 42 of the voltage monitor 20 for the third battery group 92C, which is activated the third earliest, starts to measure the elapsed time t after lapse of a predetermined time since the second start of measurement, and the measuring unit 42 of the voltage monitor 20 for the fourth battery group 92D, which is activated the fourth earliest, i.e. the latest, starts to measure the elapsed time t after lapse of a predetermined time since the third start of measurement.

In step S804, the measuring unit 42 for the first battery group 92A performs a first transmission task that wirelessly transmits, to the other measuring units 42 for the second to fourth battery groups 92B to 92D, an activation/measurement-start signal indicative of activation and/or start of measurement of the corresponding voltage monitor 20. The activation/measurement-start signal will be referred to as a measurement start signal.

In step S804, the measuring unit 42 for the second battery group 92B performs a second transmission task that wirelessly transmits, to the other measuring units 42 for the first, third, and fourth battery groups 92A, 92C, and 92D, a measurement start signal indicative of activation and/or start of measurement of the corresponding voltage monitor 20 following the first transmission task.

In step S804, the measuring unit 42 for the third battery group 92C performs a third transmission task that wirelessly transmits, to the other measuring units 42 for the first, second, and fourth battery groups 92A, 92B, and 92D, a measurement start signal indicative of activation and/or start of measurement of the corresponding voltage monitor 20 following the second transmission task.

In step S804, the measuring unit 42 for the fourth battery group 92D wirelessly transmits, to the other measuring units 42 for the first, second, and third battery groups 92A, 92B, and 92C, a measurement start signal indicative of activation and/or start of measurement of the corresponding voltage monitor 20 following the third transmission task.

Next, the measuring unit 42 for each of the battery groups 92A to 92D receives the measurement start signal upon the measurement start signal being sent from another measuring unit 42 thereto, and determines whether it has received the measurement start signals sent from all the other measuring units 42 in step S805.

Specifically, the measuring unit 42 for the battery group 92A determines whether it has received the measurement start signals sent from all the other measuring units 42 for the second to fourth battery groups 92B to 92D, and the measuring unit 42 for the battery group 92B determines whether it has received the measurement start signals sent from all the other measuring units 42 for the first, third, and fourth battery groups 92A, 92C, and 92D in step S805.

Similarly, the measuring unit 42 for the battery group 92C determines whether it has received the measurement start signals sent from all the other measuring units 42 for the first, second, and fourth battery groups 92A, 92B, and 92D, and the measuring unit 42 for the battery group 92D determines whether it has received the measurement start signals sent from all the other measuring units 42 for the first, second, and third battery groups 92A, 92B, and 92C in step S805.

Upon determining it has not received the measurement start signals sent from all the other measuring units 42 (NO in step S805), the measuring unit 42 for each of the battery groups 92A to 92D repeats the operation in step S805 every predetermined cycle.

Otherwise, upon determining to have received the measurement start signals sent from all the other measuring units 42 (YES in step S805), the measuring unit 42 for each of the battery groups 92A to 92D performs a measurement stopping operation in step S811, which will be described later.

For example, the measuring unit 42 for each of the battery groups 92A to 92D determines whether it has received the measurement start signals sent from all the other measuring units 42 for the other battery groups 92 in accordance with the number of recognized battery groups and the number of received measurement start signals.

Specifically, upon determining that the number of received measurement start signals has reached a predetermined threshold number, which is obtained by subtracting 1 from the number of recognized battery groups, the measuring unit 42 for each of the battery groups 92A to 92D determines to have received the measurement start signals sent from all the other measuring units 42 (YES in step S805).

As a first example, the measuring unit 42 for each of the battery groups 92A to 92D links, in step S804, a unique information item indicative of the corresponding voltage monitor 20 to the corresponding measurement start signal, and wirelessly transmits, to the other measuring units 42 for the other battery groups 92, the corresponding measurement start signal linked to the corresponding unique identification item. This enables the measuring unit 42 for each of the battery groups 92A to 92D to count the number of received measurement start signals whose information items are different from each other, thus obtaining the counted number as the number of received measurement start signals used in step S805.

As a second example, the measuring unit 42 for each of the battery groups 92A to 92D wirelessly transmits, to the other measuring units 42 for the other battery groups 92, the corresponding measurement start signal once within a predetermined period in step S804. Note that the predetermined period is defined to be unlikely longer than a usual time required for a worker to connect all the voltage monitors 20 to the respective battery groups 92 under assumption that the worker sequentially connects the voltage monitors 20 to the corresponding battery groups 92.

At that time, the measuring unit 42 for each of the battery groups 92A to 92D counts the number of received measurement start signals from the other measuring units 42 within the predetermined period, thus obtaining the counted number as the number of received measurement start signals used in step S805.

In step S811, the measuring unit 42 for each of the battery groups 92A to 92D stops measurement of the corresponding elapsed time t. Then, the measuring unit 42 for each of the battery groups 92A to 92D stores a present value of the elapsed time t when the measurement finishes in the storage unit 24 as the own elapsed time t in step S812.

Next, the measuring unit 42 for each of the battery groups 92A to 92D wirelessly transmits the elapsed time t at the stop of the measurement, which is the same as the own elapsed time t stored in the storage unit 24, to the assignment units 41A of the other battery groups 92 as the other elapsed time tin step S813.

In response to receiving the other lapsed-times t sent from the other measuring units 42 for the other battery groups 92 in step S813, the comparison unit 43A for each of the battery groups 92A to 92D compares each of the received other elapsed times t with the own elapsed time tin step S814. In accordance with the comparison result, the assignment unit 41 for each of the battery groups 92A to 92D performs an assignment task of assigning the first to fourth IDs to the respective voltage monitors 20 in accordance with the comparison result in step S815.

Specifically, the assignment unit 41 for each of the battery groups 92A to 92D performs the assignment task of 1. Assigning the first ID of 1 to the corresponding voltage monitor 20 upon the own elapsed time t is the largest in all the own and other elapsed times t 2. Assigning the second ID of 2 to the corresponding voltage monitor 20 upon the own elapsed time t is the second largest in all the own and other elapsed times t 3. Assigning the third ID of 3 to the corresponding voltage monitor 20 upon the own elapsed time t is the third largest in all the own and other elapsed times t 4. Assigning the fourth ID of 4 to the corresponding voltage monitor 20 upon the own elapsed time t is the fourth largest, i.e. smallest, in all the own and other elapsed times t The second embodiment configured above achieves the following benefits.

Specifically, the ID assignment system 40A provided in each voltage monitor 20 is configured to assign, to the corresponding voltage monitor 20 for the corresponding battery group 92, the corresponding ID without assistance from the battery ECU 10.

After completion of connecting all the voltage monitors 20 to the respective battery groups 92, the measuring unit 42 of each voltage monitor 20 is configured to 1. Determine whether it has received the measurement start signals sent from all the other measuring units 42

2. Automatically stop measurement of the corresponding elapsed time t and automatically transmit, by radio, the elapsed time t at the stop of the measurement, which is the same as the own elapsed time t stored in the storage unit 24, to the comparison units 43 of the other battery groups 92

This configuration therefore enables assignment of IDs to the respective voltage monitors 20 to be easily carried out while eliminating the need of any worker's working, such as turning on of a sending request switch.

Third Embodiment

Figure 9:
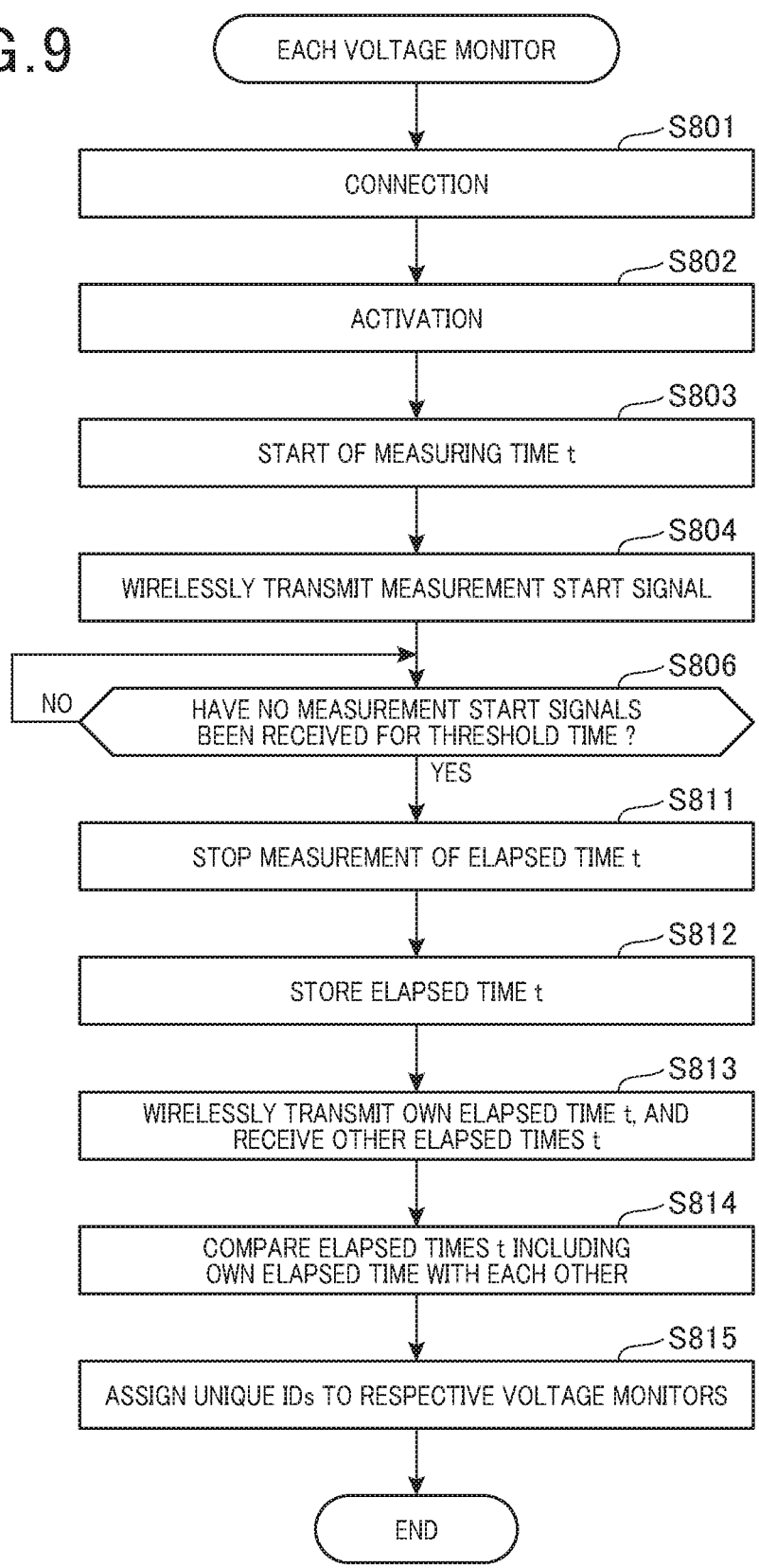
FIG. 9 is a flowchart schematically illustrating an assignment routine carried out by an ID assignment system according to the third embodiment of the present disclosure.

The following describes an ID assignment system 40A according to the third embodiment of the present disclosure with reference to FIG. 9. The configuration and functions of the ID assignment system 40A according to the third embodiment are mainly different from those of the ID assignment system 40A according to the second embodiment by the following points. The following therefore mainly describes the different points.

The measuring unit 42 of each voltage monitor 20 according to the third embodiment does not recognize the total number of battery groups 92 included in the battery pack 90, i.e. the total number of voltage monitors 20 to be connected to the battery groups 92.

FIG. 9 schematically illustrates an assignment routine according to the third embodiment carried out by the ID assignment system 40A according to the third embodiment; the assignment routine includes a step carried out by, for example, a worker.

Because the operations in steps S801 to S803 and S811 to S815 in FIG. 9 are substantially identical to those in the respective same steps in FIG. 8, descriptions of the operations in steps S801 to S803 and S811 to S815 in FIG. 9 are therefore omitted.

Referring to FIG. 9, the measuring unit 42 for each battery group according to the third embodiment wirelessly transmits, to the other measuring units 42 for the other battery groups, the activation/measurement-start signal once after activation of the corresponding voltage monitor 20 in step S804. In addition, the measuring unit 42 for each battery group according to the third embodiment performs an operation in step S806 in place of the operation in step S805.

Specifically, the measuring unit 42 for each battery group wirelessly transmits, to the other measuring units 42 for the other battery groups, the measurement start signal once after activation of the corresponding voltage monitor 20 in step S804. Subsequently to the operation in step S804, the measuring unit 42 for each battery group receives the measurement start signal upon the measurement start signal being sent from another measuring unit 42 thereto, and determines whether it has received no measurement start signals from the other measuring units 42 for at least a predetermined threshold period, of, for example, 1 minute since the last receipt of the measurement start signal sent from another measuring unit 42 in step S806. In other words, the measuring unit 42 for each battery group determines whether the predetermined threshold period has elapsed since the last receipt of the measurement start signal sent from another measuring unit 42 in step S806.

Upon determining to have received the measurement start signal from another measuring unit 42 for the predetermined threshold period since the last receipt of the measurement start signal sent from another measuring unit 42 (NO in step S806), the measuring unit 42 for each battery group repeats the operation in step S806. That is, upon determining that the predetermined threshold period has not elapsed since the last receipt of the measurement start signal sent from another measuring unit 42 (NO in step S806), the measuring unit 42 for each battery group repeats the operation in step S806.

Otherwise, upon determining it has not received the measurement start signal from another measuring unit 42 for the predetermined threshold period since the last receipt of the measurement start signal sent from another measuring unit 42 (YES in step S806), the measuring unit 42 for each battery group performs the measurement stopping operation of stopping measurement of the corresponding elapsed time t in step S811. That is, upon determining that the predetermined threshold period has elapsed since the last receipt of the measurement start signal sent from another measuring unit 42 (YES in step S806), the measuring unit 42 for each battery group performs the measurement stopping operation of stopping measurement of the corresponding elapsed time t in step S811.

Note that the predetermined threshold period is defined to be unlikely longer than a usual time required for a worker to connect a voltage monitor 20 to a corresponding battery group 92 under assumption that the worker sequentially connects the voltage monitors 20 to the corresponding battery groups 92.

That is, upon determining that the predetermined threshold period has elapsed since the last receipt of the measurement start signal sent from another measuring unit 42 (YES in step S806), the measuring unit 42 for each battery group easily determines that there are no voltage monitors 20 that should be connected to battery groups.

The third embodiment configured above achieves the following benefits.

Specifically, the ID assignment system 40A provided in each voltage monitor 20 according to the third embodiment is configured to 1. Determine whether it has received no measurement start signals from the other measuring units 42 for at least the threshold period 2. Automatically stop measurement of the corresponding elapsed time t upon determining to have received no measurement start signals from the other measuring units 42 for at least the threshold period and automatically transmit, by radio, the elapsed time t at the stop of the measurement, which is the same as the own elapsed time t stored in the storage unit 24, to the comparison units 43 of the other battery groups 92

This configuration therefore enables assignment of IDs to the respective voltage monitors 20 to be easily carried out while eliminating the need of any worker's working, such as turning on of a sending request switch.

Fourth Embodiment

Figure 10:
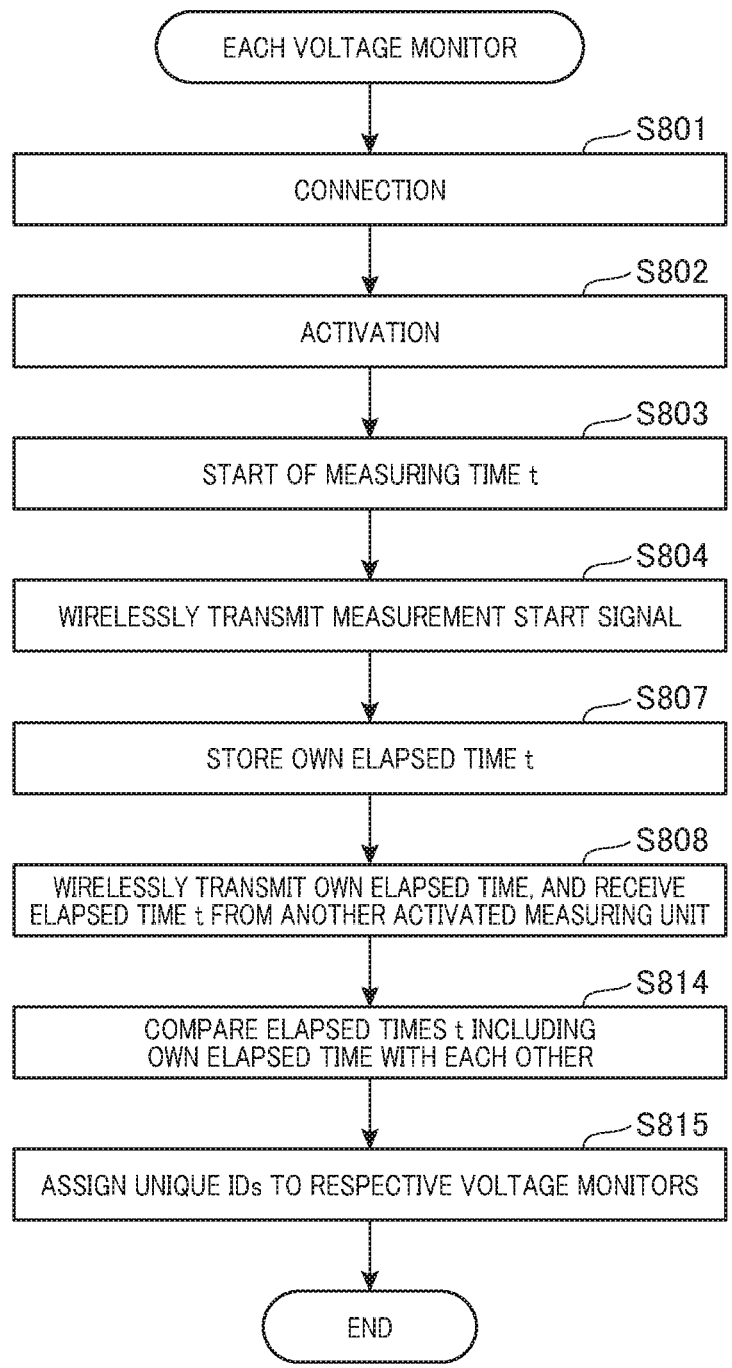
FIG. 10 is a flowchart schematically illustrating an assignment routine carried out by an ID assignment system according to the fourth embodiment of the present disclosure.

The following describes an ID assignment system 40A according to the fourth embodiment of the present disclosure with reference to FIG. 10. The configuration and functions of the ID assignment system 40A according to the fourth embodiment are mainly different from those of the ID assignment system 40A according to the third embodiment by the following points. The following therefore mainly describes the different points.

FIG. 10 schematically illustrates an assignment routine according to the third embodiment carried out by the ID assignment system 40A according to the fourth embodiment; the assignment routine includes a step carried out by, for example, a worker.

Because the operations in steps S801 to S803, S814, and S815 in FIG. 10 are substantially identical to those in the respective same steps in FIG. 9, descriptions of the operations in steps S801 to S803, S814, and S815 in FIG. 10 are therefore omitted.

Referring to FIG. 10, the measuring unit 42 of the voltage monitor 20, which is newly activated, for a corresponding battery group according to the fourth embodiment starts to measure the elapsed time t of the corresponding voltage monitor 20 in response to the new activation of the corresponding voltage monitor 20 in step S803.

Subsequent to the start of measuring the elapsed time t of the newly activated voltage monitor 20 in step S803, the measuring unit 42 of the newly activated voltage monitor 20 updates a value of the measured elapsed time t of the corresponding voltage monitor 20 in the storage unit 24 every predetermined period in step S807.

Subsequent to or in parallel with the operation in step S807, the measuring unit 42 and the comparison unit 43A of the newly activated voltage monitor 20 cooperatively perform a wireless receiving task of wirelessly receiving the elapsed time t from another measuring unit 42 that has been already activated in step S808.

In step S808, the comparison unit 43A for the newly activated voltage monitor 20 also reads a present value of the elapsed time t of the corresponding voltage monitor 20 stored in the storage unit 24 at the receipt of the elapsed time t from another measuring unit 42 that has been already activated.

Specifically, in step S808, the measuring unit 42 and the comparison unit 43A of the newly activated voltage monitor 20 can be configured to cooperatively perform the wireless receiving task to thereby 1. Wirelessly transmit, every predetermined transmission period, a corresponding value of the measured elapsed time t of the corresponding voltage monitor 20 to the other comparison units 43A 2. Wirelessly receive a value of the elapsed time t wirelessly transmitted from another measuring unit 42

3. Read a present value of the elapsed time t of the corresponding voltage monitor 20 stored in the storage unit 24 at the receipt of the elapsed time t from another measuring unit 42 that has been already activated For example, like the first embodiment, the fourth embodiment assumes that a worker's connection work of connecting the voltage monitors 20 to the first to fourth battery groups 92A to 92D is carried out in order from the first battery group 92A to the fourth battery group 92D.

Figure 11:
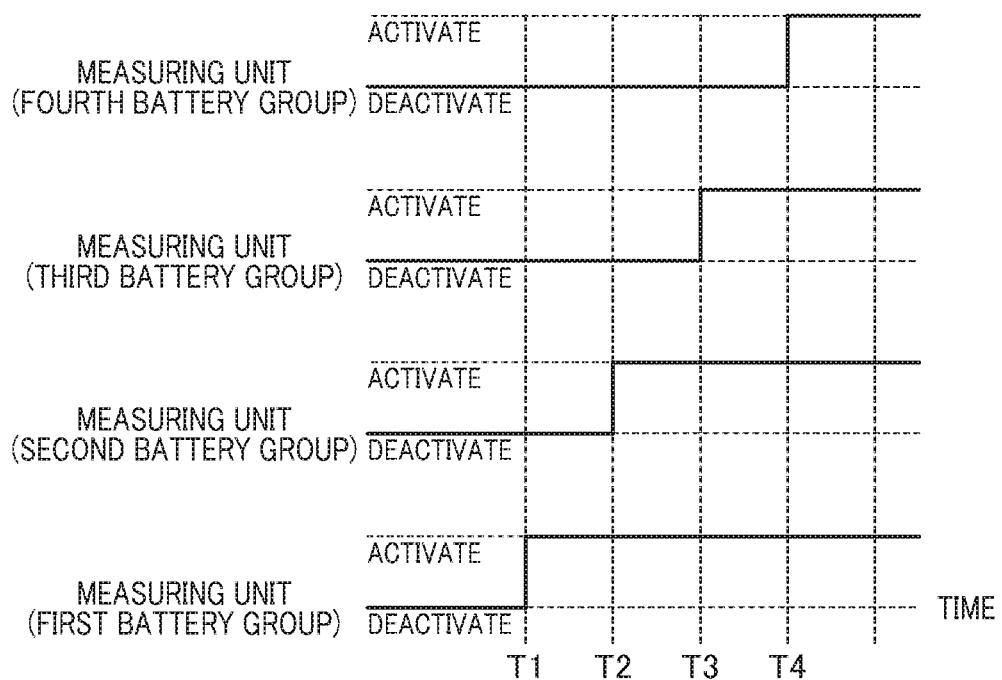
FIG. 11 is a timing chart schematically illustrating how an elapsed time measured by a measuring unit of each voltage monitor is changed over time according to the fourth embodiment.

In this assumption, the voltage monitor 20 for the first battery group 92A is newly activated, so that the measuring unit 42 for the first battery group 92A starts to measure the elapsed time t at time T1 (see FIG. 11) in response to activation of the corresponding voltage monitor 20, and wirelessly transmits, every predetermined transmission period, a corresponding value of the measured elapsed time t of the corresponding voltage monitor 20 to the other comparison unit 43 (see step S808).

At that time, because the other voltage monitors 20 for the second to fourth battery groups 92B to 92D are not activated, no elapsed times are transmitted from the other measuring units 42 to the measuring unit 42 for the first battery group 92A at the start of the elapsed time measurement. The comparison unit 43A therefore determines that the elapsed time t transmitted from the measuring unit 42 for the first battery group 92A is the largest as a comparison result.

This causes the assignment unit 41 for the first battery group 20A to assign the first ID of 1 to the voltage monitor 20 for the first battery group 92A in steps S814 and S815.

After activation of the voltage monitor 20 for the first battery group 92A, the voltage monitor 20 for the second battery group 92B is newly activated, so that the measuring unit 42 for the second battery group 92B starts to measure the elapsed time t at time T2 in response to activation of the corresponding voltage monitor 20, and wirelessly transmits, every predetermined transmission period, a corresponding value of the measured elapsed time t of the corresponding voltage monitor 20 to the other assignment units 41 (see step S808).

At that time, because the voltage monitor 20 for the first battery group 92B has been already activated, the elapsed time t is transmitted from the other measuring unit 42 for the first battery group 92A to the measuring unit 42 for the first battery group 92A immediately after the start of the elapsed time measurement. Then, the comparison unit 43A for the second battery group 20B compares the present value of the own elapsed time t with the elapsed time t transmitted from the measuring unit 42 for the first battery group 92A.

Because the elapsed time t transmitted from the measuring unit 42 for the first battery group 92A is larger than the present value of the own elapsed time t, the assignment unit 41 for the second battery group 92B assigns the second ID of 2 to the voltage monitor 20 for the second battery group 92B in steps S814 and S815.

Similarly, after activation of the voltage monitor 20 for the second battery group 92B, the voltage monitor 20 for the third battery group 92C is newly activated, so that the measuring unit 42 for the third battery group 92C starts to measure the elapsed time t at time T3 in response to activation of the corresponding voltage monitor 20, and wirelessly transmits, every predetermined transmission period, a corresponding value of the measured elapsed time t of the corresponding voltage monitor 20 to the other ID comparison unit 43A (see step S808).

At that time, because the voltage monitors 20 for the first and second battery groups 92A and 92B have been already activated, the elapsed times t are transmitted from the other measuring units 42 for the other battery groups 92A and 92B to the measuring unit 42 for the third battery group 92C immediately after the start of the elapsed time measurement. Then, the comparison unit 43A for the third battery group 20C compares the present value of the own elapsed time t with the elapsed times t transmitted from the measuring units 42 for the respective first and second battery groups 92A and 92B.

Because the elapsed times t transmitted from the measuring units 42 for the first and second battery groups 92A and 92B are larger than the present value of the own elapsed time t, the assignment unit 41 for the third battery group 92C assigns the third ID of 3 to the voltage monitor 20 for the third battery group 92C in steps S814 and S815.

Additionally, after activation of the voltage monitor 20 for the third battery group 92C, the voltage monitor 20 for the fourth battery group 92D is newly activated, so that the measuring unit 42 for the fourth battery group 92D starts to measure the elapsed time t at time T4 in response to activation of the corresponding voltage monitor 20, and wirelessly transmits, every predetermined transmission period, a corresponding value of the measured elapsed time t of the corresponding voltage monitor 20 to the other comparison unit 43A (see step S808).

At that time, because the voltage monitors 20 for the first to third battery groups 92A to 92C have been already activated, the elapsed times t are transmitted from the other measuring units 42 for the other battery groups 92A to 92C to the measuring unit 42 for the fourth battery group 92D immediately after the start of the elapsed time measurement. Then, the comparison unit 43 for the fourth battery group 20D compares the present value of the own elapsed time t with the elapsed times t transmitted from the measuring units 42 for the respective first to third battery groups 92A to 92C.

Because the elapsed times t transmitted from the measuring units 42 for the first to third battery groups 92A to 92C are larger than the present value of the own elapsed time t, that is, the present value of the own elapsed time t is the smallest, the assignment unit 41 for the fourth battery group 92D assigns the fourth ID of 4 to the voltage monitor 20 for the fourth battery group 92D in steps S814 and S815.

As another example, in step S808, the measuring unit 42 and the comparison unit 43A for a newly activated voltage monitor 20 can be configured to cooperatively perform the wireless receiving task to thereby 1. Wirelessly transmit a sending request to the other measuring units 42 for the other battery groups 2. Wirelessly receive a value of the elapsed time t wirelessly transmitted from another measuring unit 42

3. Wirelessly transmit a value of the elapsed time t of the corresponding voltage monitor 20 to the other comparison units 43A for the other battery groups in response to receiving the value of the elapsed time t wirelessly transmitted from another measuring unit 42

4. Read a present value of the elapsed time t of the corresponding voltage monitor 20 stored in the storage unit 24 in response to receiving the value of the elapsed time t wirelessly transmitted from another measuring unit 42

That is, the comparison unit 43A for each voltage monitor 20 compares the present value of the own elapsed time t with the elapsed time t transmitted from another measuring unit 42, and the assignment unit 41 assigns a proper ID to the corresponding voltage monitor 20 in accordance with the comparison result in steps S814 and S815.

The fourth embodiment configured above achieves the following benefits.

Specifically, the ID assignment system 40A provided in each voltage monitor 20 according to the fourth embodiment is configured to assign a proper ID to the corresponding voltage monitor without stopping measurement of the elapsed time t. This configuration therefore makes it possible to, each time a new battery group 92 is connected to a corresponding voltage monitor 20, assign a proper ID to the corresponding voltage monitor 20.

Modifications

The present disclosure is not limited to the first to third embodiments set forth above, and can be variously modified.

The ID assignment systems 40 and 40A described above can be applied to assign proper IDs to respective battery units, the battery units can be the battery groups 92 or batteries.

For example, the comparison unit 43 is installed in the battery ECU 10 according to the first embodiment, but the present disclosure is not limited to this configuration. Specifically, the comparison unit 41 according to the first embodiment can be installed in a selected one of the voltage monitors 20.

The comparison unit 43 can be provided separately from the battery ECU 41 and each voltage monitor 20, so that the comparison unit 43 can be separately provided from the battery monitor apparatus 80. Because the comparison unit 43 according to this modification does not belong to the battery monitor apparatus 80, if there are many battery monitor apparatuses 80, the battery monitor apparatuses 80 can share the comparison unit 43, so that the comparison unit 43 enables a proper ID to be assigned to each voltage monitor 20 included in each battery monitor apparatus 80.

In each of the first to fourth embodiments, a worker manually connects the voltage monitors 20 to the respective battery groups 92A to 92D, but a machine can be configured to automatically connect the voltage monitors 20 to the respective battery groups 92A to 92D.

The assignment unit 41 according to each of the first to fourth embodiments is configured to assign IDs to the voltage groups 92A to 92D in a predetermined order from the first battery group 92A to the fourth battery group 92D on the premise that the first to fourth battery groups 92A to 92D are connected to the respective voltage monitors 20 in a potential ascending order from the first battery group 92A to the fourth battery group 92D. The present disclosure is however not limited to this configuration.

Specifically, the assignment unit 41 according to a modification can be configured to assign IDs to the voltage groups 92A to 92D in a predetermined order from the fourth battery group 92D to the first battery group 92A on the premise that the first to fourth battery groups 92A to 92D are connected to the respective voltage monitors 20 in a potential descending order from the fourth battery group 92D to the first battery group 92A.

Additionally, the assignment unit 41 according to another modification can be configured to assign IDs to the voltage groups 92A to 92D in a predetermined order that is in conformity with an actual connection order of the voltage monitors 20 to the battery groups 92A to 92D.

For example, if the battery groups 92A to 92D are aligned in the battery pack 90 in a predetermined alignment order of the first battery group 92A, the third battery group 92C, the second battery group 92B, and the fourth battery group 92D, a worker connects the voltage monitors 20 to the battery groups 92A to 92D in the predetermined alignment order. In this case, the assignment unit 41 according to a further modification can be configured to assign IDs to the voltage groups 92A to 92D in a predetermined order that is in conformity with the predetermined alignment order.

As another example, a worker connects the voltage monitors 20 to the battery groups 92A to 92D in a predetermined connection workability order. In this case, the assignment unit 41 according to a still further modification can be configured to assign IDs to the voltage groups 92A to 92D in a predetermined order that is in conformity with the predetermined connection workability order.

The battery ECU 10 according to the first embodiment can be configured such that the sending request switch 12 can be wirelessly connected to the MCU 13 without using the signal wiring γ. Specifically, the sending request switch 12 according to this modification can be configured to wirelessly transmit the sending request signal to the MCU 13 when being turned on by a user or worker, and stop sending of the sending request signal to the MCU 13 when turned off by a user or worker.

In place of the operation in step S504, the measuring unit 42 for each battery group 92, which has recognized the total number of battery groups 92, according to a first modification of the first embodiment can perform a transmission task of wirelessly transmitting, to the other measuring units 92, the measurement start signal (see step S804). Then, upon determining to have received the measurement start signals sent from all the other measuring units 42 (YES in step S805), the measuring unit 42 for each battery group 92 can perform the operations in steps S105 and 106, 205 and 206, 305 and 306, or 405 and 406 to thereby wirelessly transmit the own elapsed time t to the comparison unit 43A.

Similarly, in place of the operation in step S504, the measuring unit 42 for each battery group 92 according to a second modification of the first embodiment can perform a transmission task of wirelessly transmitting, to the other measuring units 92, the measurement start signal (see step S804). Then, the measuring unit 42 for each battery group 92 can determine whether it has received no measurement start signals from the other measuring units 42 for at least the predetermined threshold period, of, for example, 1 minute since the last receipt of the measurement start signal sent from another measuring unit 42 (see step S806). At that time, upon determining it has not received the measurement start signal from another measuring unit 42 for the predetermined threshold period since the last receipt of the measurement start signal sent from another measuring unit 42 (YES in step S806), the measuring unit 42 for each battery group 92 can perform the operations in steps S105 and 106, 205 and 206, 305 and 306, or 405 and 406 to thereby wirelessly transmit the own elapsed time t to the comparison unit 43A.

The comparison unit 43A is installed in each voltage monitor 20 according to the fourth embodiment, but the present disclosure is not limited to this configuration.

Specifically, the comparison unit 43A according to a third modification of the fourth embodiment can be installed in the battery ECU 10, which is similar to the configuration of the first embodiment, or can be provided separately from the battery ECU 10 and each voltage monitor 20.

At that time, the measuring unit 42 of the newly activated voltage monitor 20 can be configured to wirelessly transmit the sending request to the other measuring units 42 for the other battery groups, and wirelessly transmit the own elapsed time t to the comparison unit 43A in step S808. This enables the comparison unit 43A to receive the elapsed times t from the respective measuring units 42. Then, the comparison unit 43A can be configured to compare the elapsed times t from the respective measuring units 42 with each other to thereby cause the assignment unit 41 of the newly activated voltage monitor 20 to assign a proper ID to the newly activated voltage monitor 20.

Like the second embodiment, the measuring unit 42 for each battery group 92, which has recognized the total number of battery groups 92, according to a fourth modification of the fourth embodiment can be configured to stop measurement of the elapsed time t upon wirelessly receiving the elapsed times t wirelessly transmitted from the other measuring units 42.

Like the third embodiment, the measuring unit 42 for each battery group 92 according to a fifth modification of the fourth embodiment can be configured to 1. Wirelessly transmit the measurement start signal to the other measuring units 42

2. Stop measurement of the elapsed time t upon having received no measurement start signal from the measuring unit 42 of a newly activated voltage monitor 20 for a predetermined period The functions of one element in each of the embodiments can be distributed as plural elements, and the functions that plural elements have can be combined into one element. At least part of the structure of each of the embodiments can be replaced with a known structure having the same function as the at least part of the structure of the corresponding embodiment. A part of the structure of each of the embodiments can be eliminated. At least part of the structure of each of the embodiments can be added to or replaced with at least part of the structure of other embodiments.

All aspects included in the technological ideas specified by the language employed by the claims constitute embodiments of the present disclosure.

While the illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those having ordinary skill in the art based on the present disclosure. The limitations in the claims are to be interpreted broadly based on the language employed in the claims and not limited to examples described in the present specification or during the prosecution of the application, which examples are to be construed as non-exclusive.

The invention claimed is:

1. An identifier assignment system for assigning identifiers to respective voltage monitors to be connected to respective battery units, the identifier assignment system comprising:

a plurality of measuring units provided for the respective voltage monitors, each measuring unit being configured to:
measure elapsed time information indicative of an elapsed time that has elapsed since a predetermined point of time after an activation of the corresponding voltage monitor based on power supplied from the corresponding battery unit connected to the corresponding voltage monitor; and
wirelessly transmit the elapsed time information about the corresponding voltage monitor;

a comparison unit configured to:
receive the elapsed time information about each voltage monitor wirelessly transmitted from the corresponding measuring unit; and
perform a comparison task of comparing the elapsed times of the respective voltage monitors with each other; and an assignment unit configured to assign unique identifiers to the respective voltage monitors in accordance with a result of the comparison task.

2. The identifier assignment system according to claim 1, wherein:
the voltage monitors are wirelessly communicable with a battery controller;
the comparison unit is installed to the battery controller or is provided separately from the battery controller and each voltage monitor; and
the comparison unit is configured to wirelessly transmit, to the assignment unit, the result of the comparison task.

3. The identifier assignment system according to claim 1, wherein:
the comparison unit comprises a plurality of comparison units provided in the respective voltage monitors;
each comparison unit provided in the corresponding voltage monitor is configured to perform, as the comparison task, a comparison of an own elapsed time that is the elapsed time of the corresponding voltage monitor with the elapsed times of the other voltage monitors; and
an assignment unit configured to assign the unique identifiers to the respective voltage monitors in accordance with a result of the comparisons performed by the respective comparison units.

4. The identifier assignment system according to claim 2, wherein:
the assignment unit comprises a plurality of assignment unit;
each of the measuring units is configured to store, in a storage unit, the elapsed time information about the corresponding voltage monitor that is wirelessly transmitted from the corresponding measuring unit;
the comparison unit is configured to:
link, as the result of the comparison, the unique identifiers to respective items of the elapsed time information wirelessly transmitted from the respective measuring units; and
wirelessly transmit, to each of the assignment units, the unique identifiers linked to the respective items of the elapsed time information; and
each of the assignment units is configured to:
receive the unique identifiers linked to the respective items of the elapsed time information;
compare each of the items of the elapsed time information with the own elapsed time information stored in the storage unit; and assign a selected one of the identifiers to the corresponding voltage monitor upon the selected one of the identifiers matching the own elapsed time information stored in the storage unit.

5. The identifier assignment system according to claim 2, wherein:
the comparison unit is communicably connected to a sending request switch, and is configured to wirelessly transmit, to each measuring unit, a sending request in response to turn-on of the sending request switch; and
each of the measuring units is configured to wirelessly transmit the elapsed time information about the corresponding voltage monitor to the assignment unit in response to receiving the corresponding sending request.

6. The identifier assignment system according to claim 1, wherein:
each of the measuring units has recognized the number of voltage monitors, and is configured to:
wirelessly transmit a predetermined measurement start signal in response to activation of the corresponding voltage monitor; and
wirelessly transmit the elapsed time information about the corresponding voltage monitor to the assignment unit in response to receiving the measurement start signals from all the other monitoring units.

7. The identifier assignment system according to claim 1, wherein:
each of the measuring is configured to:
wirelessly transmit a predetermined measurement start signal in response to activation of the corresponding voltage monitor; and
wirelessly transmit the elapsed time information about the corresponding voltage monitor to the assignment unit upon determining to have received no measurement start signals from the other measuring units for at least a predetermined threshold period.

8. The identifier assignment system according to claim 1, wherein:
the comparison unit is configured to:
receive the elapsed time information about each of one or more activated voltage monitors in the voltage monitors wirelessly transmitted from the one or more activated voltage monitors each time one of the voltage monitors is activated; and
perform the comparison task of comparing the elapsed times about the one or more activated voltage monitors with each other.

9. An identifier assignment method for assigning identifiers to respective voltage monitors to be connected to respective battery units, the identifier assignment method comprising:
measuring elapsed time information indicative of an elapsed time that has elapsed since a predetermined point of time after an activation of the corresponding voltage monitor based on power supplied from the corresponding battery unit connected to the corresponding voltage monitor;
wirelessly transmitting the elapsed time information about the corresponding voltage monitor;
receiving the elapsed time information about each voltage monitor wirelessly transmitted from the corresponding measuring step;
performing a comparison task of comparing the elapsed times of the respective voltage monitors with each other; and
assigning unique identifiers to the respective voltage monitors in accordance with a result of the comparing step.

* * * * *